(12) United States Patent
Bieselt et al.

(10) Patent No.: US 9,663,354 B2
(45) Date of Patent: May 30, 2017

(54) MECHANICAL STRESS-DECOUPLING IN SEMICONDUCTOR DEVICE

(71) Applicant: Infineon Technologies AG, Neubiberg (DE)

(72) Inventors: Steffen Bieselt, Stadt Wehlen (DE); Dirk Meinhold, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 292 days.

(21) Appl. No.: 14/277,342

(22) Filed: May 14, 2014

(65) Prior Publication Data
US 2015/0332956 A1    Nov. 19, 2015

(51) Int. Cl.
| | |
|---|---|
| H01L 21/76 | (2006.01) |
| B81C 1/00 | (2006.01) |
| H01L 21/762 | (2006.01) |
| H01L 29/06 | (2006.01) |
| H01L 21/764 | (2006.01) |

(52) U.S. Cl.
CPC ........ *B81C 1/00063* (2013.01); *H01L 21/764* (2013.01); *H01L 21/76229* (2013.01); *H01L 29/0649* (2013.01)

(58) Field of Classification Search
CPC . H01L 21/56; H01L 21/764; H01L 21/76229; H01L 23/16; H01L 23/562
USPC .......................................... 438/422; 257/510
See application file for complete search history.

(56) References Cited

U.S. PATENT DOCUMENTS

| | | | |
|---|---|---|---|
| 7,989,310 B2 | 8/2011 | Freywald et al. | |
| 8,772,126 B2* | 7/2014 | Schulze | H01L 21/78 257/510 |
| 8,778,194 B2* | 7/2014 | Reinmuth | H05K 13/00 216/18 |
| 2003/0098493 A1* | 5/2003 | Marty | H01L 21/76229 257/510 |
| 2008/0277765 A1* | 11/2008 | Lane | H01L 21/563 257/622 |
| 2013/0087864 A1 | 4/2013 | Ten Have | |
| 2013/0168840 A1 | 7/2013 | Merassi et al. | |

FOREIGN PATENT DOCUMENTS

| | | |
|---|---|---|
| DE | 4433689 A1 | 3/1996 |
| WO | 9811602 A1 | 3/1998 |
| WO | 2008089786 A1 | 7/2008 |

* cited by examiner

*Primary Examiner* — Trung Q Dang
(74) *Attorney, Agent, or Firm* — Eschweiler & Potashnik, LLC

(57) ABSTRACT

According to a method in semiconductor device fabrication, a first trench and a second trench are concurrently etched in a semi-finished semiconductor device. The first trench is a mechanical decoupling trench between a first region of an eventual semiconductor device and a second region thereof. The method further includes concurrently passivating or insulating sidewalls of the first trench and of the second trench. A related semiconductor device includes a first trench configured to provide a mechanical decoupling between a first region and a second region of the semiconductor device. The semiconductor device further includes a second trench and a sidewall coating at sidewalls of the first trench and the second trench. The sidewall coating at the sidewalls of the first trench and at the sidewalls of the second trench are of the same material.

5 Claims, 28 Drawing Sheets

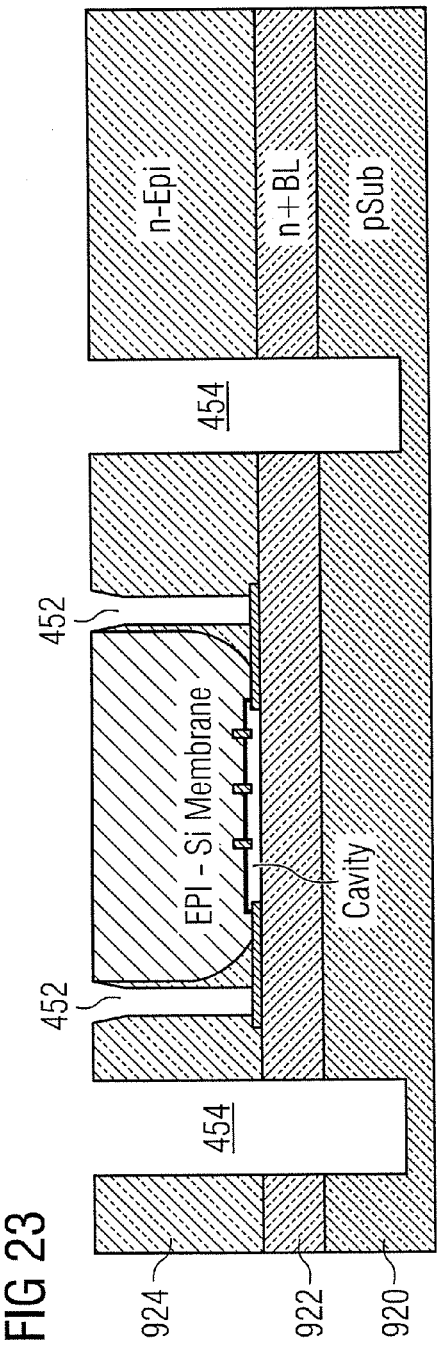
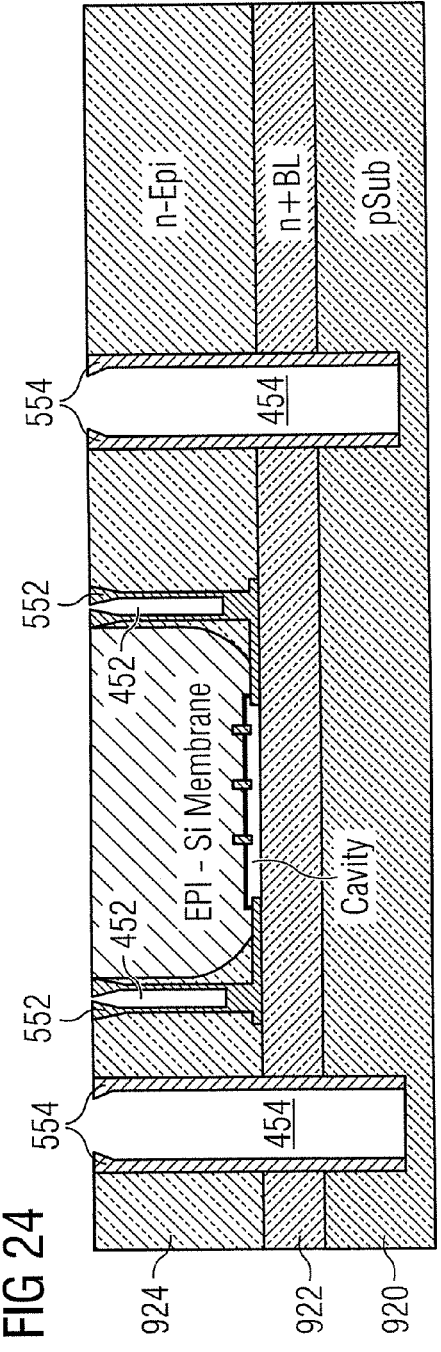

FIG 27
Detail: change in Sensor module to open („drill") Standard Trench
POR 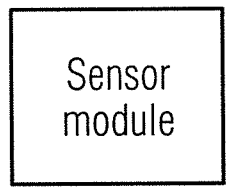
Option b) 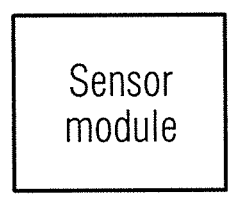
Addnl STEP: opening of standard trench
A standard trench with vertical void is created

FIG 28
Detail: change in Sensor release module to open („drill") Standard Trench
POR 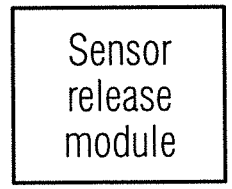
Option c) 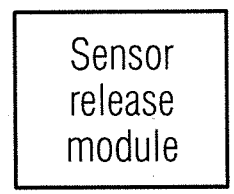
Addnl STEP: opening of standard trench
A standard trench with vertical void is created

FIG 29
Detail: change in Sensor release module to open MEMS- Trench
POR 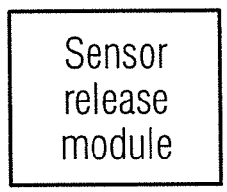
Option d) 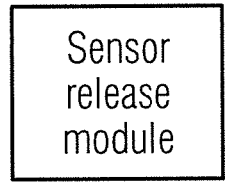
Addnl STEP: opening of MEMS Trench
The MEMS-TRENCH with preexisting vertical void is opend (STI/TEOS seal is opend up to the preexisting void)

MECHANICAL STRESS-DECOUPLING IN SEMICONDUCTOR DEVICE

FIELD

The invention relates to a method for example in the field of semiconductor device manufacturing and/or MEMS (micro electrical mechanical system) manufacturing. The invention also relates to a semiconductor device. Furthermore, the invention relates to mechanical stress-decoupling of integrated devices and to related manufacturing processes.

BACKGROUND

Semiconductor integrated devices may comprise electronic components, mechanical components, and/or transducer components. Examples for electronic components are diodes, transistors, resistors, electrical charge storage elements, etc. Mechanical components may be, for example, membranes, masses, beams, and/or springs, which may be used in acceleration sensors, pressure sensors, microphones, loudspeakers, optical micro-mirror devices, and much more. A transducer component may be or comprise a photodetector, a temperature sensor, a light sensor, a light emitting device, magnetic field sensors, or the like.

Depending on the type of the integrated semiconductor device (e.g. analog, digital, with or without transducer components that perform a conversion from an electrical signal to another physical quantity, or vice versa) an integrated semiconductor device may be affected by a drift of electrical parameters and/or other parameters. This drift of electrical/non-electrical parameters may be caused, among others, by mechanical deformations (e.g., bending) of the semiconductor die (or dice) within the package of the device, due to stress induced by the same package. Pressure sensors (p-sensors), acceleration sensors (g-sensors) or, for that matter, any integrated or stand-alone MEMS device, may in principle experience a shift of key performance indicators (sensitivity, offset, temperature dependency, linearity, resonance frequency, . . . ) from the deformation stress imposed by the package onto the substrate (or passivation).

SUMMARY

According to a suggested method, a first trench and a second trench are concurrently etched in a semi-finished semiconductor device. The first trench is a mechanical decoupling trench between a first region of the semi-finished semiconductor device and a second region thereof. The method further comprises passivating or insulating sidewalls of the first trench and of the second trench, wherein said passivating or insulating is performed concurrently in the first and second trenches.

According to a further proposed method a first trench and a second trench are etched concurrently in a substrate arrangement. The second trench has a greater width than the first trench. The method also comprises depositing a first material at sidewalls of the first trench and of the second trench. The material locally grows together near an opening of the first trench during the deposition and thus closes the first trench. As a result, a void or void filament is left within the first trench. The second trench is not closed during the deposition of the material, due to the greater width of the second trench. The method further comprises filling the second trench with a second material, but not the first trench, due to the first trench previously having been closed by the first material.

A semiconductor device comprises a first trench configured to provide a mechanical decoupling between a first region and a second region of the semiconductor device. The semiconductor device also comprises a second trench and a sidewall coating at sidewalls of the first trench and the second trench. The sidewall coating at the sidewalls of the first trench and at the sidewalls of the second trench are of the same material.

A semiconductor device comprises a front-end-of-line portion, a back-end-of-line portion, a front-end-of-line trench, and a back-end-of-line trench. The front-end-of-line trench is formed in the front-end-of-line portion and is configured to mechanically decouple a first region of the semiconductor device from a second region of the semiconductor device. The back-end-of-line trench is formed in the back-end-of-line portion and is configured to also mechanically decouple the first region from the second region. The back-end-of-line trench is laterally offset relative to the front-end-of-line trench so that a footprint of the front-end-of-line trench does not overlap with a footprint of the back-end-of-line trench.

At least some aspects and examples of implementation of the present invention are based on the finding that a mechanical decoupling of specific regions of a semiconductor device can be achieved by providing dedicated trenches along a boundary of the region to be mechanically decoupled from another region (or other regions) of the semiconductor device. According to at least some aspects described herein, it is possible to create these dedicated trenches with no or only little additional manufacturing effort if the semiconductor device comprises other trenches for different purposes, anyway (e.g., electrical insulation, providing an electrical contact for a deep-lying layer of the substrate). Some implementation examples offer a highly efficient, continuous trench for mechanical decoupling that extends through a front-end-of-line (FEOL) portion and also through a back-end-of-line (BEOL) portion of the semiconductor device. Both portions (FEOL and BEOL) of this continuous trench can be passivated in a homogenous manner. In the alternative, a mechanical decoupling can typically also be achieved by providing a trench only in the front-end-of-line portion, only in the back-end-of-line portion, or as individual, non-connected trenches in both the front-end-of-line portion and the back-end-of-line portion.

BRIEF DESCRIPTION OF THE DRAWINGS

Embodiments of the present invention are described herein making reference to the appended drawings.

FIG. 23 shows a schematic cross section of a semi-finished semiconductor device after a standard trench and a decoupling trench have been etched;

FIG. 24 shows a schematic cross section of the semi-finished semiconductor device from FIG. 27 after passivation and/or insulation of sidewalls of the trenches;

FIG. 27 schematically illustrates how a standard process module for sensor processing can be reused for an opening of a standard trench in order to provide a mechanical decoupling function;

FIG. 28 schematically illustrates how a standard process module for sensor release can be reused for an opening of a standard trench in order to provide a mechanical decoupling function; and FIG. 29 schematically illustrates an alternative to FIG. 6 of how a standard process module for sensor release can be reused for an opening of a standard trench in order to provide a mechanical decoupling function.

Figure 1:
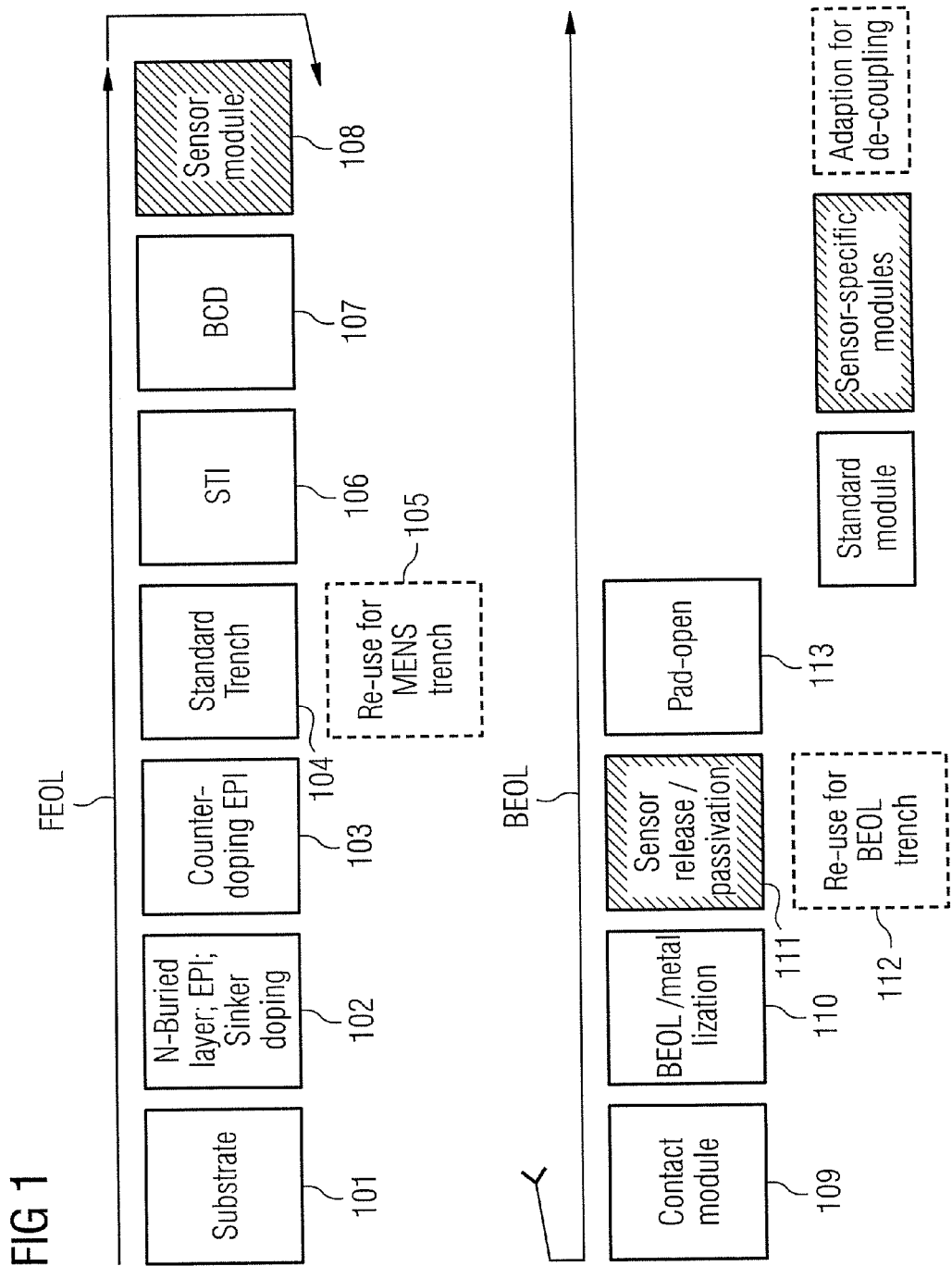
FIG. 1 shows a schematic flow chart of a manufacturing process of a semiconductor device with modifications to create trenches for mechanical decoupling.

Equal or equivalent elements or elements with equal or equivalent functionality are denoted in the following description by equal or equivalent reference numerals.

DETAILED DESCRIPTION

In the following, a plurality of details are set forth to provide a more thorough explanation of the embodiments of the present invention. However, it will be apparent to those skilled in the art that embodiment of the present invention may be practiced without these specific details. In other instances, well-known structures and devices are shown in block diagram form or in a schematic view rather than in detail in order to avoid obscuring embodiments of the present invention. In addition, features of the different embodiments described hereinafter may be combined with each other, unless specifically noted otherwise.

Research in the semiconductor industry is to some extent driven by the desire to integrate devices and circuits for different purposes into one monolithic chip. For example, bipolar and CMOS control circuitry plus DMOS power devices may be integrated on the same monolithic structure (Smart Power Technology, SPT). The abbreviation SPT9 designates the ninth generation which is, at the time this text is written, the latest generation. The SPT9 technology can be characterized as a 130 nm embedded flash node.

Besides integrating different electronic technologies (e.g., bipolar and CMOS technology) into one monolithic structure, it may be interesting to integrate non-electronic structures, as well. For example, sensors, transducers, mechanical parts, may be integrated with electronic circuits for driving, controlling and observing the sensors, transducers, mechanical parts, etc. For example, for the SPT9 base technology an integrated pressure sensor may be envisaged.

Various options exist for implementing the membrane of a pressure sensor. For example, a first option could be an EPI-Silicon lamella (epitaxial silicon lamella). A second option could be a Poly-Silicon lamella (polycrystalline silicon lamella). To give an idea of the dimensions, the EPI-Silicon lamella could be between 3 . . . 6.7 µm thick, whereas the Poly-Silicon lamella could be approximately 300 nm thin (that is, ten time thinner). In particular for the Poly- Silicon lamella, package-induced stress onto the sensor element may become critical. It would therefore be desirable to find frontend-integration options to de-couple substrate-stress (imposed by package) from the sensor element.

One option to achieve a more stress-resistant sensor lamella may be to enhance the thickness of the lamella (with respect to the substrate). That means to get the same sensor sensitivity it is necessary to enlarge the sensor footprint. Besides the area penalty this bears certain risks during manufacturing (cracks) as the sensor dimensions reach, e.g., planarization lengths of CMP (chemical mechanical processing) processes or resonance frequencies (ultrasonic cleans).

As an alternative to a thicker membrane, a special trench around the sensor element may be implemented which is able to decouple the lateral package stress (for different kinds of pressure sensor lamellas). This special trench may have a preexisting void or void filament or may be filled with a sacrificial material which is later removed. It may be manufactured separately or together with the SPT9 trench. This trench may be used for mechanical decoupling a first region of the semiconductor device from a second region, such as a surrounding region around the first region. Mechanical decoupling may be achieved by eliminating any force-fit connections between the first region and the second region. However, mechanical decoupling may also be achieved by reducing the amount or the cross-sectional area of force-fit connections between the first and second regions. In other words, the first region and the second region may still be connected at one or more selected points so that the first region is supported by the second region, or vice versa. Nevertheless, the one or more selected points of connection do not transmit mechanical stress from the second region to the first region, or vice versa, or only a small amount of mechanical stress compared to a solid, continuous connection between the first and second regions.

The BEOL (Back End Of Line) on top of the special trench may be removed, either by a dedicated etch or together with the sensor release etch. The sacrificial material may be removed; the trench may obtain a passivation. In addition, by means of the Venetia process, a decoupling may be achieved vertically. The so called Venetia process is a process for manufacturing an SOI wafer by annealing and oxidation of buried channels. The process name derives from similarities between the house building technique used in the city of Venice (basement on pile-works) and the process itself.

The proposed trenches may be useful for stress decoupling of different sensor devices. Typically, a reduced or removed crack risk can be expected and there is no additional cost adder, because the decoupling trench can be run together (structured) with the SPT9 process.

The implementation of a defined trench-void which may be able to decouple manufacturing and package stress from different kinds of pressure sensor lamellas or other structures that would benefit from reducing mechanical stress. The cavity of the decoupling trench may be reopened with the Far-BEOL Sensor release etch, for example. One or more of these stacked trenches may be used as a stress decoupling seal ring around sensors. It may be considered to fabricate such decoupling seal rings on top of buried Venezia structures (SOI/SON) for improved decoupling.

Overview of some of the possible options:
(1) Using a Venetia process (formed prior to nBL+EPI in case of SPT9p) to decouple the sensor element from the substrate vertically [for poly-lamella sensor concept only]
(2) Using a trench to de-couple the sensor element from the substrate laterally
(3) Using a trench, filled with an pre-existing void or a sacrificial material like silicon oxide, while the silicon oxide is removed later in process to achieve an empty trench
(4) Using an etch to remove the BEOL above the Trench, opening of the pre-existing void or removal of the sacrificial material
(5) Using the sensor release etch (WL etch) to remove the BEOL above the Trench, opening of the pre-existing void or removal of the sacrificial material
(6) Combination of (1) with (1+n)
(7) Using the SPT9 TR trench module to fabricate a suitable Trench by e.g. reducing the TR-CD, i.e., the trench width (hampering the poly fill)

FIG. 1 shows a schematic flow chart of a manufacturing process for semiconductor devices comprising a sensor, such as a pressure sensor, acceleration sensor, etc. The manufacturing process can be subdivided in two main stages, namely the front-end-of-line (FEOL) process and the back-end-of-line (BEOL) process. The manufacturing process may be further broken down into several modules. In FIG. 1, modules that are identical to those of a standard manufacturing process are called "standard modules" and are depicted in FIG. 1 as white boxes with continuous outline. Other modules depicted in FIG. 1 are sensor-specific modules which are depicted as boxes with a diagonal hatch pattern. Boxes with a dashed outline indicate an adoption, modification, or extension of a standard module to support the formation of decoupling trenches for mechanical decoupling.

The manufacturing process typically begins with providing a substrate, at step 101. The material of the substrate may be, for example, silicon, germanium, or another suitable semiconductor. The substrate may exhibit a base doping and may be provided in the form of a wafer.

During a process module 102, a future n-buried layer (nBL) may be formed at a surface of the substrate by performing a corresponding doping process. Generally, a p-doped buried layer would also be possible, but this is less common. An epitaxial layer (EPI) may then be grown at the surface of the n-buried layer. Using a doping process, a so called sinker (e.g., n-sinker, p-sinker is less common but nevertheless possible) may be formed within a portion of the epitaxial layer. The n-sinker may typically reach from an exposed surface of the epitaxial layer to the n-buried layer nBL. The individual steps belonging to process module 102 are typically optional and may be omitted. The epitaxial layer may be counter-doped at a step 103 (optional).

Although not mentioned in FIG. 1, the process module 102 may comprise additional process steps for creating a functional part of a micro electro mechanical system (MEMS), i.e., a functional MEMS part. The functional MEMS part may be a membrane of a pressure sensor, a suspended mass of an acceleration sensor, a MEMS actuator, a MEMS comb drive, or something similar. For example, a pressure sensor may comprise an epitaxially grown lamella (or membrane or diaphragm) with a thickness between 2.5 µm and 6.7 µm, for example. In the case of a relatively thick lamella with a thickness of approximately 6.7 µm, the most of the parts of the pressure sensor may be structured subsequent to the creation of the nBL. In the alternative, the p-EPI deposition may be interrupted and the sensor may be integrated into the p-EPI layer, which leads to a sensor with a thinner lamella, for example approximately 2.5 µm. In both cases, a significant part of the sensor is already structured prior to a creation of a JA-implant (sinker), an EPI inverse doping, and subsequent process modules, such as the trench module 104 and the shallow trench isolation (STI) module 106. The morphology of the epitaxially grown lamella is influenced by the material where the epitaxy starts. This material typically also serves as a sacrificial material which is removed, dissolved, or etched away at a later stage. According to a first process variant, the sacrificial material is an oxide, for example silicon oxide. In this case the lamella will be formed as a poly-crystalline silicon lamella. According to a second process variant, the sacrificial material is a silicon-germanium alloy SiGe, which results in an EPI-Si-lamella. Further choices for the sacrificial material may also be possible and lead to specific morphologies of the lamella.

As an alternative to the epitaxially grown lamella, another sensor structure may be implemented in which the lamella is made from amorphous silicon (aSi) with a lamella thickness between approximately 200 nm and 400 nm. This amorphous silicon lamella is structured at a later stage, typically after a BCD module 107.

Process group 104 is aimed at creating standard trenches in the substrate, the nBL, and/or the epitaxial layer. The standard trench may be intended for electrically contacting the nBL through the epitaxial layer. Another function of a standard trench may be a lateral electrical insulation between two laterally adjacent regions of the substrate. The standard trench module may comprises photolithography steps and an etching step, for example an anisotropic etching step, a dry etching step, a reactive ion etching step (RIE), and/or a deep reactive ion etching step (DRIE). Furthermore, the standard trench module 104 may comprise steps for sidewall passivation/insulation and for trench filling.

The standard trench module 104 may be modified or extended by a MEMS trench module 105. The term "MEMS trench" refers here to a future decoupling trench for mechanically decoupling the first region of the future semiconductor device from the second region. The MEMS trench module 105 may modify the standard trench module for example by defining additional trenches in a photolithography mask that have a smaller width than the standard trenches. This typically leads to a reduced etching depth for the narrower additional trenches compared to the standard trenches. Furthermore, the modification of the standard trench module 104 by the MEMS trench module 105 may result in that, during the passivation/insulation of the sidewalls, the additional trenches are closed near their openings because the passivation/insulation material that is deposited at the sidewalls of the trenches tends to grow together near the opening where the material enters the trench. The standard trenches are typically wide enough to remain open throughout the passivation/insulation process. In contrast, the narrower MEMS trenches (future decoupling trenches) are typically prone to said closure by passivation/insulation material during a sidewall passivation/insulation step. This closure of the MEMS trenches leaves a void or cavity within the MEMS trench. The void or cavity can be exploited for the purposes of mechanical decoupling, because no tensile force, compressive force, and/or shear force can be transmitted across the void or cavity.

The standard manufacturing process may continue with a shallow trench isolation (STI) module 106 and a BCD module 107. The abbreviation BCD stands for "bipolar, CMOS, DMOS" which is a popular combined technology for power ICs (integrated circuits). However, the proposed decoupling trenches can be used with other technologies, as well, such as bipolar technology, CMOS technology, DMOS technology, MEMS technology, etc.

The manufacturing process further comprises a sensor module 108 configured to perform the steps for providing a sensor, such as a pressure sensor. Above we have discussed, by way of example, two options for structuring the lamella of a pressure sensor and possible further parts of the sensor structure: a) epitaxially grown lamella with a thickness between 2.5 µm and 6.7 µm, and b) amorphous silicon lamella (aSi lamella) with a thickness between 200 nm and 400 nm. In the case a) of the epitaxially grown lamella combined with one of several options for providing a decoupling trench, the standard trench(es) intended for decoupling may be cleared or "excavated" at this point in the manufacturing process, namely between the BCD module of the FEOL section and the BEOL section. In the case b) of an amorphous silicon lamella, the sensor including the lamella may be structured at this point, wherein a carbon layer may serve as the sacrificial layer.

The sensor module 108 concludes the FEOL section of the manufacturing process. The BEOL section takes over and begins with a contact module 109 which is part of the standard manufacturing process. This is also true for the subsequent BEOL/metallization module 110. A subsequent sensor release/passivation module 111 is a sensor-specific module. The sacrificial layer beneath the lamella may be removed during this module 111, leaving a cavity that can be used for pressure sensing by exploiting a change of the capacitance between the lamella and the opposing bottom of the cavity in response to a deformation of the lamella.

According to some aspects proposed herein, the sensor release/passivation module 111 can be modified by a re-use for BEOL trench module 112, as will be explained below more in detail.

At the end of the BEOL section, a standard pad-open module 113 is performed.

Figure 2:
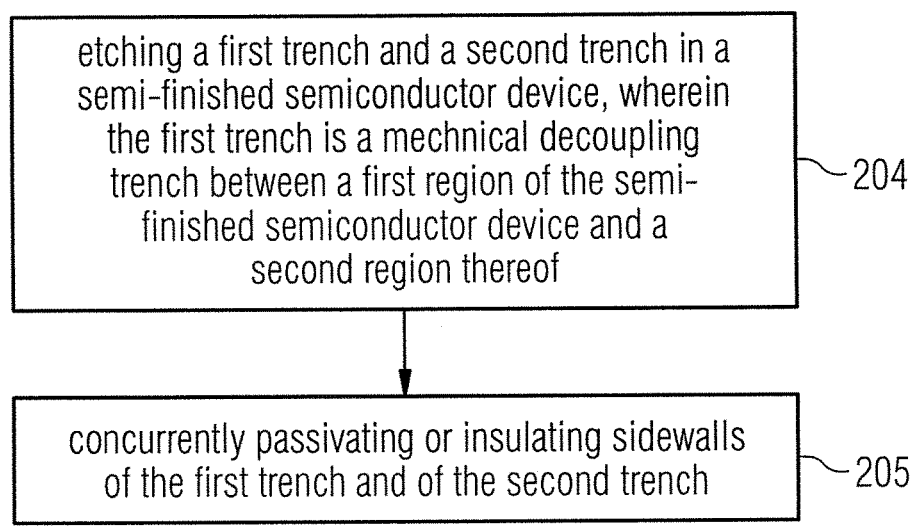
FIG. 2 shows a schematic flow chart of a manufacturing process according to an implementation example.

FIG. 2 shows a schematic flow diagram according to an implementation example of the proposed method. The method may be a method for manufacturing a semiconductor device, or a portion of a semiconductor device manufacturing method. The method comprises a step or sub-process 204 of etching a first trench and a second trench in a semi-finished semiconductor device. The first trench is intended as a future mechanical decoupling trench between a first region of an eventual semiconductor device and a second region thereof. The eventual semiconductor device corresponds to the semi-finished semiconductor device after further processing.

The method may further comprise a step or sub-process 205 of concurrently passivating or insulating the sidewalls of the first trench and the second trench.

The second trench is typically not a mechanical decoupling trench and may also be referred to as "non-decoupling trench". Instead, the second trench may be, for example, a contacting trench configured to provide an electrical contact for a buried structure that is at a certain depth into the substrate arrangement. For example, the contacting trench may provide an electrical contact for the actual substrate that is located beneath an electrically well-conducting layer (n-doped or p-doped buried layer, depending on the doping type of the substrate), such as the nBL. In the alternative, the second trench may function as an insulating trench between two adjacent structures. Hence the second trench may be regarded as a standard trench or an electrically functional trench (that is, providing an electrical contact, or providing an insulation, or acting as a gap of a capacitor, to name just a few possible examples). In embodiments where a fourth trench is present, the foregoing remarks relative to the second trench may also be applicable to the fourth trench.

Note that according to the terminology used in this description, the first trench and, where present, a third trench provide a mechanical decoupling function. In contrast, the second trench and, where present the fourth trench, are typically not intended (or not primarily intended) for providing a mechanical decoupling function, but rather fulfill alternative functions, for example electrical functions.

According to at least some implementation examples, the actions of currently etching and concurrently passivating may be performed during a front-end-of-line (FEOL) process or a back-end-of-line (BEOL) process. In the case of the front-end-of-line process, the first trench and the second trench may be formed in a front-end-of-line portion of the semi-finished semiconductor device. Likewise in the case of the back-end-of-line process, the first trench and the second trench may be formed in a back-end-of-line portion of the semi-finished semiconductor device.

According to at least some implementation examples, the method may further comprise a step or sub-process of etching a third trench in the semi-finished semiconductor device. The third trench may be a further mechanical decoupling trench between the first region and the second region of the semi-finished semiconductor device in the back-end-of-line portion. The first trench and the second trench may be formed in the front-end-of-line portion. The third trench may prevent that mechanical stress is introduced into the first region via the BEOL stack of the semiconductor device, or at least reduce the amount and/or magnitude of such mechanical stress. For reasons of manufacturability and reliability of the resulting semiconductor device, one may choose to perform separate etching steps (or sub-processes) in the FEOL stage and in the BEOL stage of the manufacturing process. In this manner, the two separate etching steps can be selected, for example, in accordance with the materials that shall be etched by the etching step.

According to at least some implementation examples, the first trench and the third trench may be aligned to each other in a direction perpendicular to a main surface of the semi-finished semiconductor device.

According to at least some implementation examples, etching the third trench may comprise re-opening the first trench. The first trench may be closed, obstructed, or filled with some previously applied passivation material and/or trench fill material, for example during the FEOL stage of the manufacturing process. This "plug" which closes or fills the first trench may be removed by the etching step of sub-process that is performed during the BEOL stage, due to a compatibility or etchability of the plug material with respect to the etching step that is performed during the BEOL stage. A part of the plug may have been formed during a shallow trench isolation (STI) sub-process. Typically, an additional step of forming a trench to reach the "plug" of the first trench has to be performed prior to re-opening. As an alternative, it may be possible to perform a further etching step during the BEOL stage after the third trench has been etched and a layer has been reached that separates the third trench from the first trench. This separating layer may then be etched by the further etching step. The method may further comprise a step of concurrently passivating the sidewalls of the first trench and sidewalls of the third trench. As an alternative, the first trench may already comprise a passivation layer at its sidewalls. In this case it may be possible to perform a passivation of the third trench that connects with the already existing passivation of the first trench in order to provide a continuous passivation.

According to at least some implementation examples, passivating or insulating the sidewalls of the first trench may cause the first trench to be closed at a surface-near end of the first trench. As a result, a void or void-filament may be formed within the first trench. The second trench is possibly not closed when passivating or insulating the sidewalls, for example due to a larger trench width of the second trench.

According to at least some implementation examples, the method may further comprise performing a release etch of a structure of the semi-finished semiconductor device during a back-end-of-line process. The first trench may be re-opened during the release etch. A release etch is a process by which a functional element (typically a movable or deformable element, such as a membrane, a cantilever, a mass, etc.) is released from an underlying substrate (or layer) by etching away a sacrificial layer. Sometimes the release etch may additionally refer to the removal of sacrificial material laterally surrounding the functional element or covering the functional element. By combining the re-opening of a the first trench with the release etch, a process step that is performed anyway can be re-used and exploited for the purposes of providing a mechanical decoupling by means of decoupling trenches, so that no or only little additional costs are caused by re-opening the first trench. However, it should be noted that re-opening the first trench is optional at least in some implementation examples, so that the first trench could remain closed, in particular if the first trench encloses a void or void-filament.

According to at least some implementation examples, the second trench may be wider than the first trench. During the step of concurrently passivating/insulating the first and second trenches this fact may result in that the sidewalls (and possibly the bottom) of the first trench are covered with the passivation and/or insulation material.

According to at least some implementation examples the method may further comprise a Venetia process to form a cavity beneath the first region to provide a mechanical decoupling of the first region in a direction perpendicular to a main surface of the semi-finished semiconductor device. The cavity may extend substantially parallel to said main surface at a depth within the semi-finished semiconductor device. The first trench may extend at least to the depth of the cavity and may merge with the cavity. The cavity may comprise a plurality of tubes that extend parallel to the main surface. Alternatively, the cavity may have a flat or plate-like shape. The Venetia process may be adjusted in such a manner that one or more pillars are preserved within the cavity. These pillars may provide a support for the first region.

According to at least some implementation examples the first and second trench may be formed in a front-end-of-line portion of the semi-finished semiconductor device and the method may further comprise a step of sub-process of filling at least the first trench with a fill material subsequent to passivating or insulating the sidewalls of the first trench. Later, the first trench may be at least partially cleared out by etching the fill material, a passivation material of the sidewall of the first trench, and/or an insulation material of the sidewall of the first trench.

Figure 3:
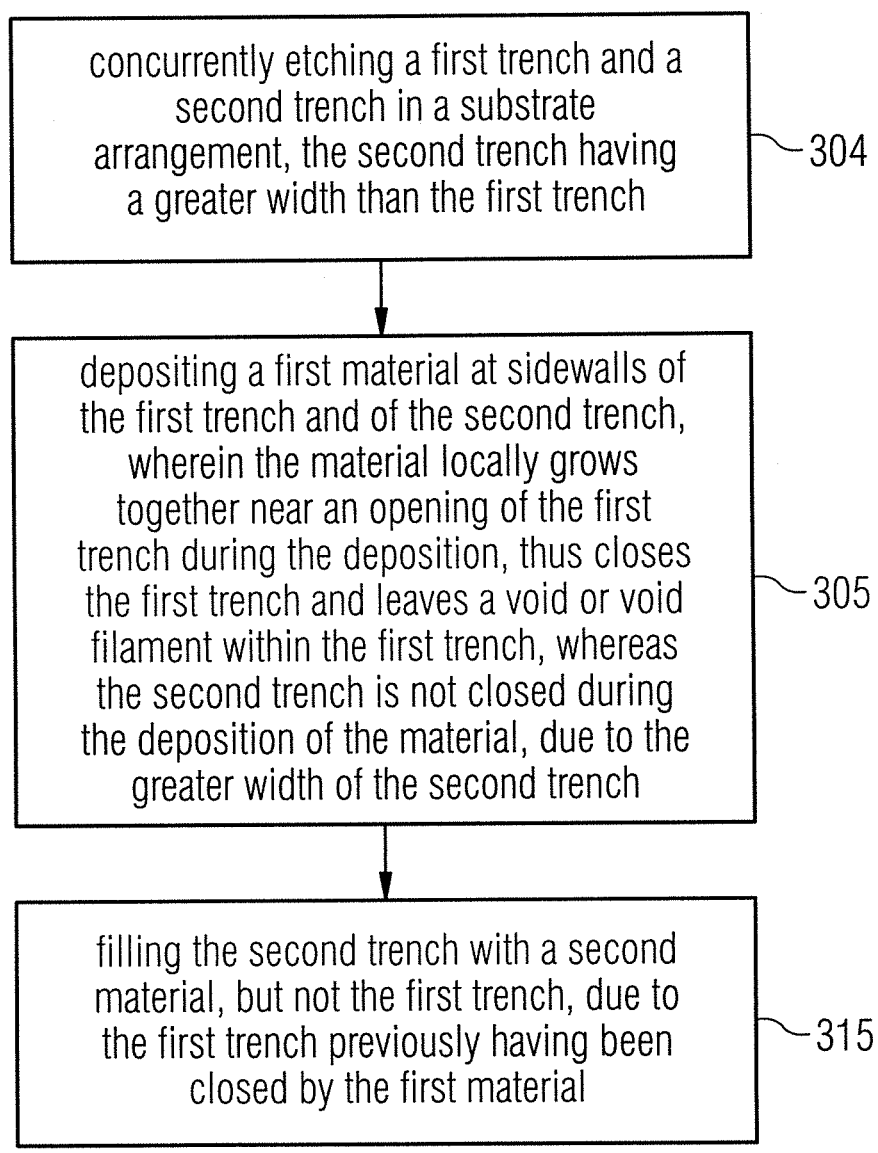
FIG. 3 shows a schematic flow chart of a manufacturing process according to a further implementation example.

FIG. 3 shows a schematic flow diagram according to another implementation example of the proposed method. The method comprises a step or sub-process 304 of concurrently etching a first trench and a second trench in a substrate arrangement. The second trench may have a greater width than the first trench. The substrate arrangement may comprise a base substrate ("bulk") and possible one or more additional layers, such as the above-mentioned n-doped buried layer nBL and the epitaxial layer. The substrate may be considered as the entity that serves as the basis for performing the following process step.

The method may further comprise a step or sub-process 305 of depositing a first material at sidewalls of the first trench and of the second trench. Typically, the material locally grows together near an opening of the first trench during the deposition and thus closes the first trench and leaves a void or void filament within the first trench. However, the second trench is not closed during the deposition of the material, due to the greater width of the second trench. The second trench is typically a standard trench that is intended to be used for other purposes than mechanical decoupling. For this reason, it is typically desired to keep the second trench open throughout the passivation/insulation step of the sidewalls. Note that typically the bottoms of the first and second trenches are also covered by the passivation/insulation material. Depending on the intended function of the second trench, the passivation/insulation material may be removed from the bottom of the second trench by etching (e.g., anisotropic etching, dry etching, or the like).

During a step or sub-process 315 the second trench may be filled with a second material. The first trench is not filled with said second material as the first trench has been closed previously by the first material. The second material may be, for example, poly-crystalline silicon (poly-Si).

The method schematically described in FIG. 3 may comprise further steps or details, as described above in connection with FIG. 2.

FIGS. 4 to 7 show several stages of a manufacturing process as schematic cross sections of a semiconductor device comprising a EPI-Si membrane.

Figure 4:
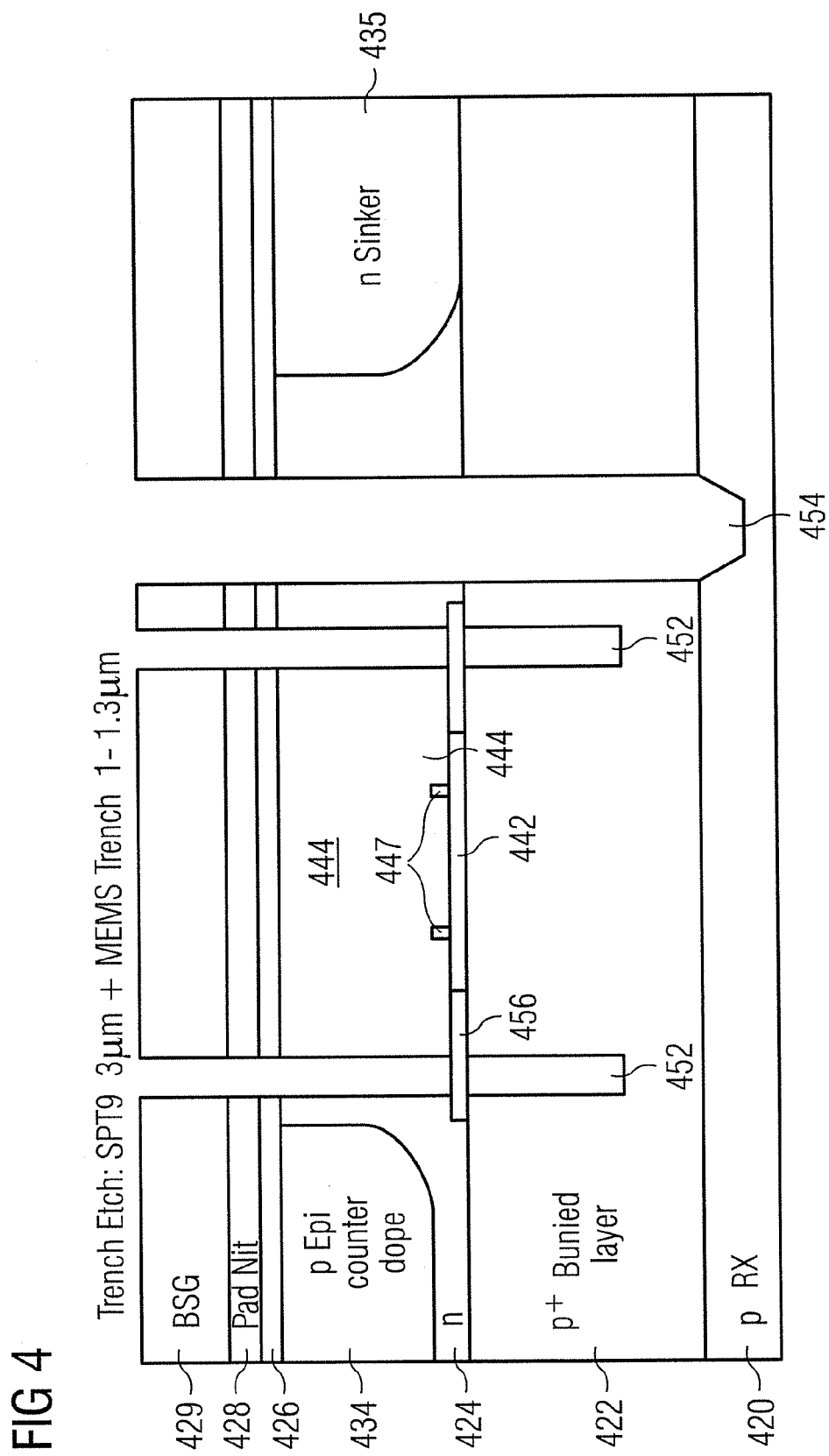
FIG. 4 shows a schematic cross section of a semiconductor device during manufacturing subsequent to a trench etching step.

FIG. 4 shows a schematic cross section of a semi-finished semiconductor device after the etching step of the trench module 104 has been performed. The semi-finished semiconductor device comprises a substrate arrangement which itself comprises the following layers: bulk substrate 420, n+ buried layer (nBL) 422, epitaxial layer 424, a layer of silicon oxide 426, a pad nitride layer 428, and a second layer of borosilicate glass (BSG) 429. In this implementation example, the bulk substrate 420 is p-doped. The nBL 422 is strongly n-doped and therefore has a high electrical conductivity. The epitaxial layer 424 is n-doped with a moderate doping concentration and therefore exhibits typical semiconductor behavior. The layers 426 and 429 act as electrical insulations. The pad nitride layer 428 acts as an electrical insulation, too.

The epitaxial layer 424 comprises a counter-doped portion 434 that may be used in subsequent processing modules as a p-doped well for p-channel field effect transistors and the like. An n-sinker 435 is also provided in order to provide an electrical contact to the nBL 422.

A cavity 442 is formed between a portion of the nBL 422 and a portion 444 of the epitaxial layer 424. The portion 444 will be used as the membrane of the eventual semiconductor device. The cavity 442 may be used as a gap of a capacitor having a variable gap width, wherein the gap width is a function of a pressure difference between an ambient pressure and the pressure within the cavity 442, in the exemplary case of a pressure sensor. Other sensor types may exploit different physical effects. The cavity 442 may have been created by removing a sacrificial material. Residues 456 of the sacrificial material that delimit and seal the cavity 442 laterally are schematically depicted in FIG. 4. The "sealing" of the cavity 442 may comprise silicon oxide or silicon nitride 447.

A first trench 452 and a second trench 454 have been formed in the substrate arrangement by a preceding etching step. The first trench 452 is relatively narrow and less deep than the second trench 454. For same etching technologies, the width of the trench also affects the depth that can be attained within a given amount of time. In the depicted example, the first trench 452 extends from the BSG layer 429 down to the nBL 422 and even into the nBL 422. Note that the trench 452 may surround the future EPI-Si membrane 444 so that the two trench cross sections that are visible in FIG. 4 may actually belong to the same trench 452. The second trench 454 extends from the BSG layer 429 down to the bulk substrate 420 and may be used later as an electrical contact for the bulk substrate 420. In order to give some purely exemplary dimensions, the first trench (MEMS trench) 452 may be between 1 µm and 1.3 µm wide and its depth may be between 7 µm and 12 µm. The second trench 454 (SPT9 standard trench) may be approximately 3 µm wide and attain a depth of approximately 20 µm.

Figure 5:
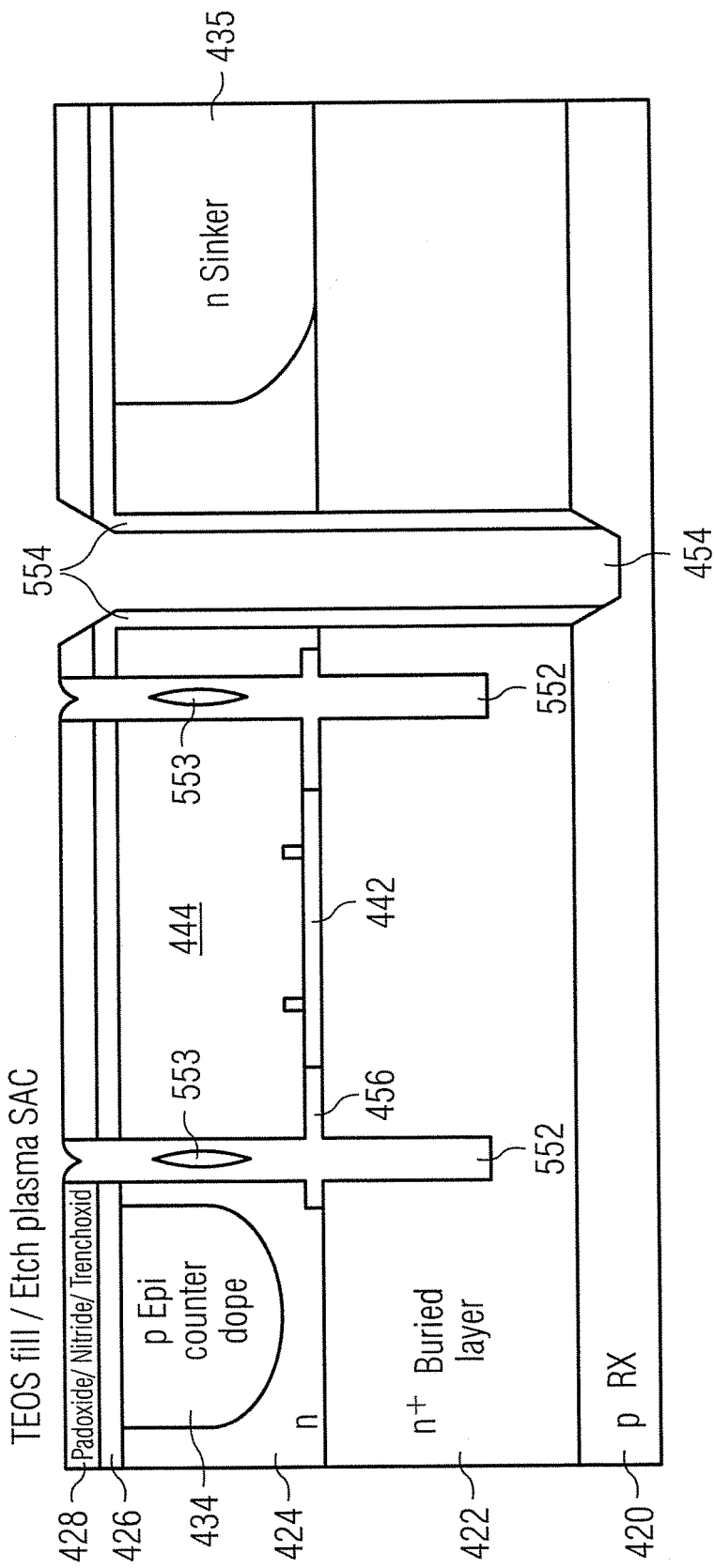
FIG. 5 shows a schematic cross section of the semiconductor device from FIG. 8 after a passivation and/or insulation material has been deposited, among others, at the sidewalls of the standard trench and the decoupling trench.

FIG. 5 shows a schematic cross section after a TEOS fill (tetraethyl orthosilicate fill) and a subsequent etch plasma SAC (self-aligned contact) has been performed. The TEOS fill results in the sidewalls of the first and second trenches 452 and 454 from FIG. 4 to be covered with TEOS, which may act as a passivation and/or insulation material. The first trench 452 is relatively narrow so that the TEOS 552 that is deposited at two opposite sidewalls eventually grows together in some portions of the first trench 452. However, the TEOS deposition within the first trench 452 may result in the creation of a void or void filament 553. The creation of the void or void filament may be desired in some implementation examples that are described herein.

The sidewalls of the second trench 454 are also covered with TEOS 554. Typically, also the bottom of the trench 454 is covered by TEOS. However, the etch plasma SAC step removes the deposited TEOS from the bottom of the trench 454 and also from the upper surface of the structure shown in FIG. 5, that is, from the upper surface of the pad nitride layer 428. The BSG layer 429 is also removed. A center hole remains in the second trench 454 which extends down to the substrate 420.

Figure 6:
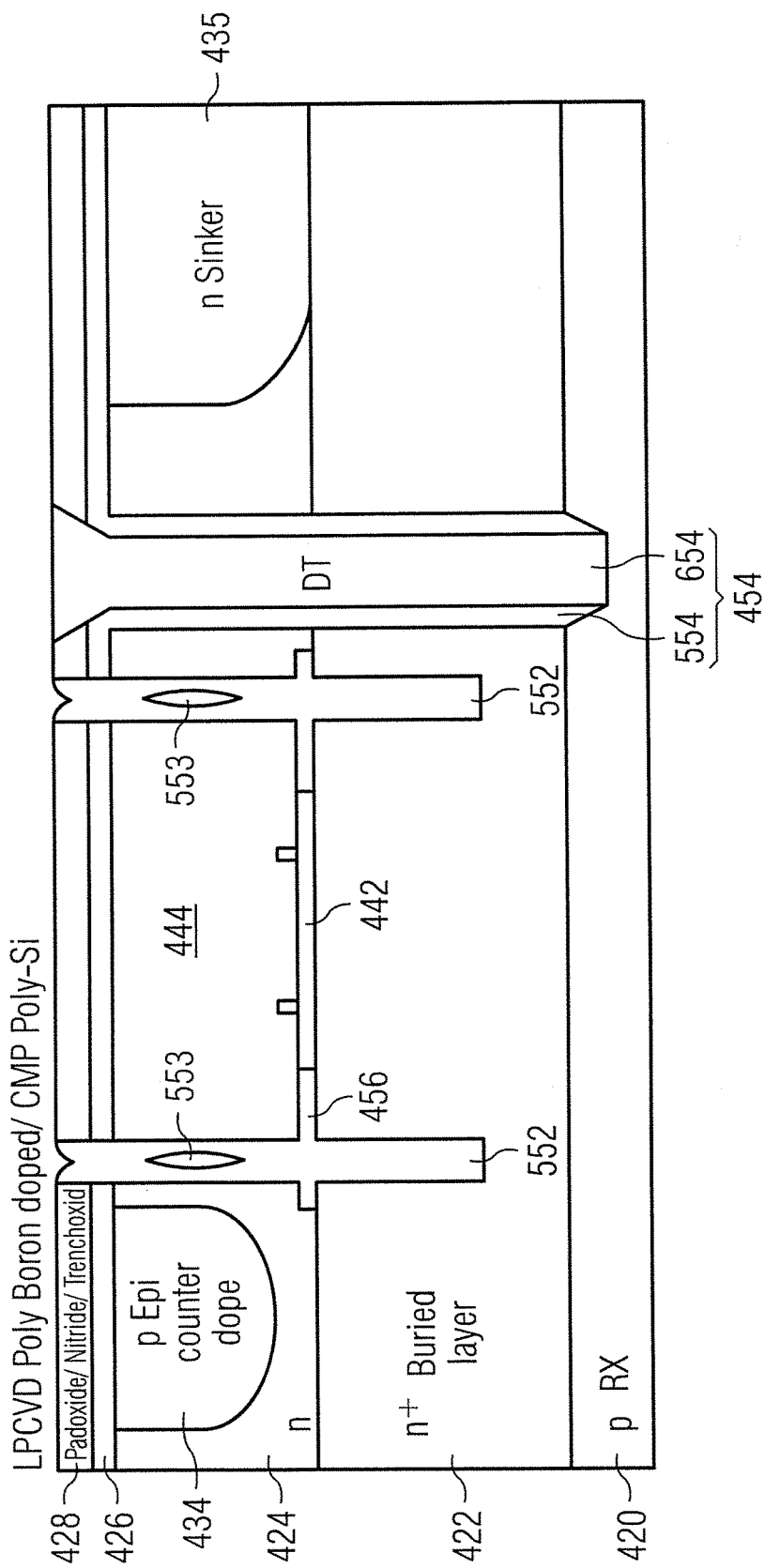
FIG. 6 shows a schematic cross section of the semiconductor device from FIG. 9 after the standard trench has been filled with a fill material, e.g. poly-crystalline silicon, and a chemical-mechanical polishing has been performed.

FIG. 6 shows a schematic cross section through the semi-finished semiconductor device after a further processing step or sub-process has been performed. A low-pressure chemical vapor deposition (LPCVP) of poly-crystalline silicon (poly-Si) doped with boron has been performed. Among others, the poly-Si 654 fills the hole in the second trench 454. The abbreviation "DT" in FIG. 6 means "deep trench".

Figure 7:
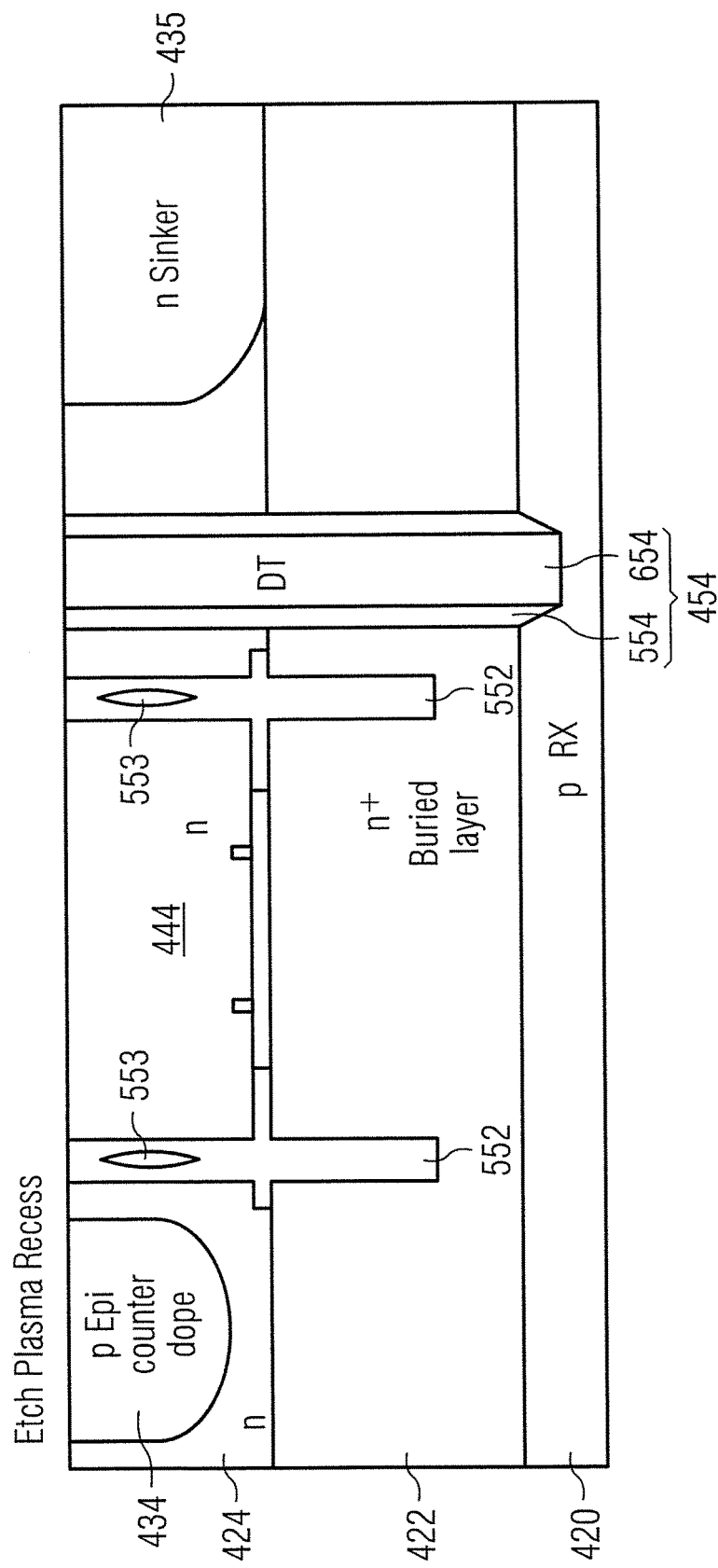
FIG. 7 shows a schematic cross section of the semiconductor device from FIG. 10 after a plasma etching step has been performed.

In FIG. 7 the semi-finished semiconductor device is schematically shown after an etch plasma recess step has been performed in order to remove the pad nitride layer 428 and the silicon oxide layer 426. The etch plasma recess step leaves an exposed upper surface of the epitaxial layer 424, the p-Epi counter-doped well 434, and the n-sinker 435.

Figure 8:
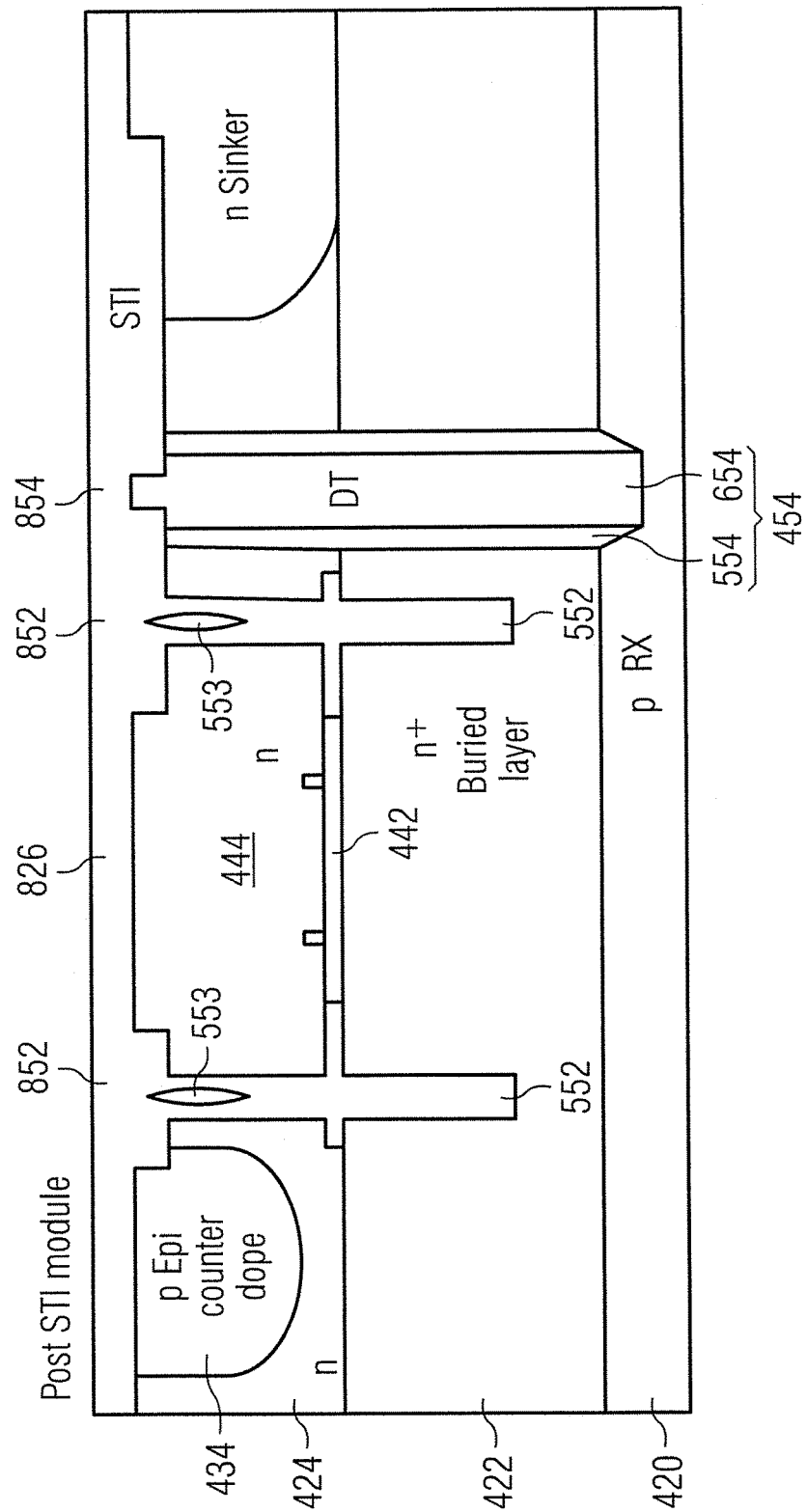
FIG. 8 shows a schematic cross section of the semiconductor device from FIG. 11 after a shallow trench isolation (STI) has been performed.

FIG. 8 shows a schematic cross section after a shallow trench isolation (STI) process module has been performed. Hence, the corresponding process stage may be termed "post STI module". Shallow trench isolation is typically performed in order to electrically isolate adjacent devices or contacts. Shallow trench isolation may be based on a selective oxidation of silicon. The STI module closes the second trench (e.g., standard SPT9 trench) with an oxide structure 854. Similarly, the first trench is also covered with an oxide structure 852. The remaining upper surface of the epitaxial layer 424 may be covered by an oxide layer 826 substantially concurrently with the formation of the oxide structures 854 and 852. The oxide structure 854 seals the poly-Si core 654 of the second trench. Due to the special trench closing with STI oxide, it is possible to do a reopening of the void within the first trench 452 during the far BEOL Sensor release etch process module that will be performed at a later time.

Figure 9:
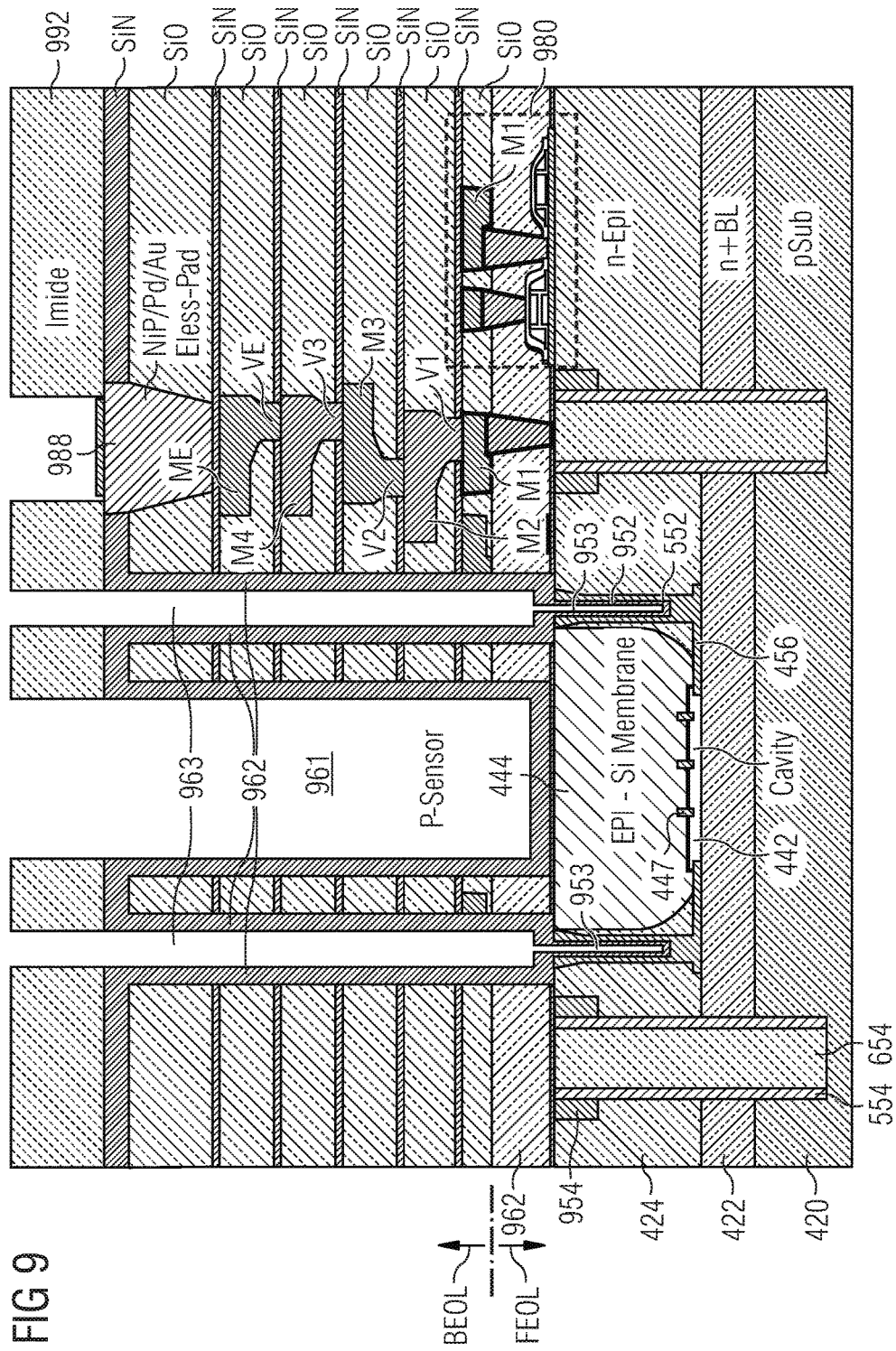
FIG. 9 shows a schematic cross section of a semiconductor device comprising an epitaxial silicon membrane (EPI-Si membrane) and integrated stress de-coupling within the sensor isolation trench with separate BEOL open design.

FIG. 9 schematically shows a first option for an SPT9P pressure sensor comprising an epitaxial silicon membrane (EPI-Si-membrane) 444. The membrane 444 is adjacent to the cavity 442 and at the opposite side to a sensor opening 961. A pressure difference between the sensor opening 961 and the cavity 442 causes the membrane 444 to be deflected by a specific amount which changes the gap width of the cavity 442. The change of the gap width of the cavity 442 can be detected and evaluated via measuring the capacitance between the membrane 444 and the nBL 422. It should be noted that the example of a pressure sensor serves as an example, only, and that alternative sensors, actuators, electronic devices, micromechanical devices, etc. may replace the pressure sensor. Indeed, many MEMS devices, electronic devices, micromechanical device may benefit from an efficient protection against mechanical stress that is induced by, for example, packaging the semiconductor chip.

The semiconductor device shown in FIG. 9 further comprises at least one electronic component 980, such as a MOSFET (metal-oxide-semiconductor field effect transistor). Furthermore, the semiconductor device comprises a BEOL (back-end-of-line) stack of alternating silicon oxide (SiO) layers and silicon nitride (SiN) layers. The BEOL stack also comprises vias V1, V2, V3, VE and metallizations M1, M2, M3, M4, and ME. A NiP/Pd/Au Eless pad may be used for electrically connecting the semiconductor device by means of bond wires, for example. An imide layer 992 protects the semiconductor device.

The semiconductor device also comprises a FEOL (front-end-of-line) portion. The FEOL portion may typically end with a PSG (phosphosilicate glass) layer 962 and a silicon carbide (SiC) seal layer. Other materials are also possible.

FIG. 9 schematically illustrates an integrated Stress decoupling within the sensor isolation trench and with separate BEOL open design. The sensor opening 961 may have been formed by means of a BEOL etch and/or sensor release etch.

The semiconductor device in FIG. 9 comprises a first trench 953 and a third trench 963, both of which are intended to function mainly as mechanical decoupling trenches. The first trench 953 and the third trench 963 are vertically aligned with each other and connected to each other. The sidewalls of the first trench and the third trench are covered with a passivation material 952 and 962. The passivation material 952, 962 may have been deposited concurrently within the first trench 953 and the third trench 963. Alternatively, the passivation material 952 may have been deposited earlier, for example during the FEOL process, and the passivation material 962 may have been deposited later, for example during the BEOL process. An opening at the bottom of the third trench 963 in order to open the first trench 953 may have been provided during the BEOL process.

The structure shown in FIG. 9 typically performs stress de-coupling of the sensor portion against the surrounding substrate and BEOL stack. The size of the membrane 444 can be chosen so that a reduced or removed crack risk can be achieved. Typically, the provision of the decoupling trenches (first and third trenches) is no additional cost adder, in particular because the trench(es) can be run together with a standard SPT9 process. The proposed mechanical decoupling trench(es) and the corresponding method for manufacturing are highly compatible with existing manufacturing processes so that it is easy to integrate the proposed solution with said existing manufacturing processes.

The semiconductor device further comprises one or more second trenches filled with a passivation/insulation material 554 and a poly-Si core 654. It is typically possible to etch the first trench and the second trench concurrently during the FEOL process. As the first trench 953 is more narrow than the second trench (here already filled with passivation 554 and poly-Si core 654), the etch process that is used results in a greater depth of the second trench than for the first trench. For example, the first trench (MEMS trench, or mechanical decoupling trench) may have an initial trench width CD between 1.1 μm and 1.7 μm which may result in a depth of approximately 7 μm to 12 μm. The second trench (standard trench) may have an initial trench width CD of approximately 3 μm and a resulting depth of approximately 20 μm.

Figure 10:
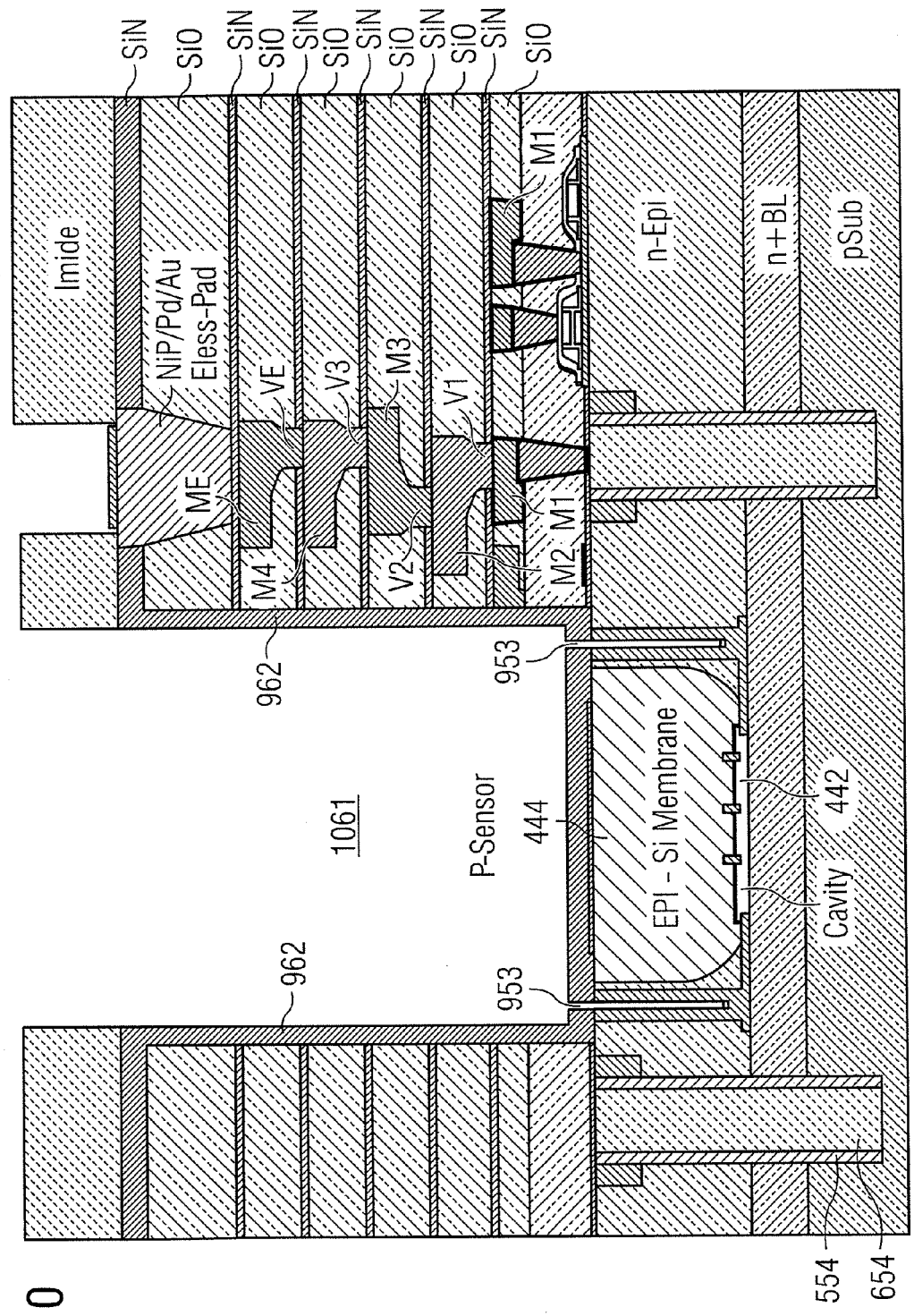
FIG. 10 shows a schematic cross section of a semiconductor device similar to FIG. 13 but with a BEOL portion of the decoupling trench(es) being combined with a sensor opening.

FIG. 10 shows a schematic cross section of a semiconductor device that is similar to FIG. 9. The difference between the implementations schematically shown in FIGS. 9 and 10 is that in FIG. 10 a second option for a SPT9P EPI-Si-membrane is shown that provides integrated stress-decoupling within the sensor isolation trench. In other words, the first trench(es) 953 is/are open at their upper ends to the sensor opening 1061. In alternative implementation examples, the first trench(es) 953 may be closed but still arranged beneath the sensor opening 1061 which is in these implementation examples slightly larger than the membrane 444.

Figure 11:
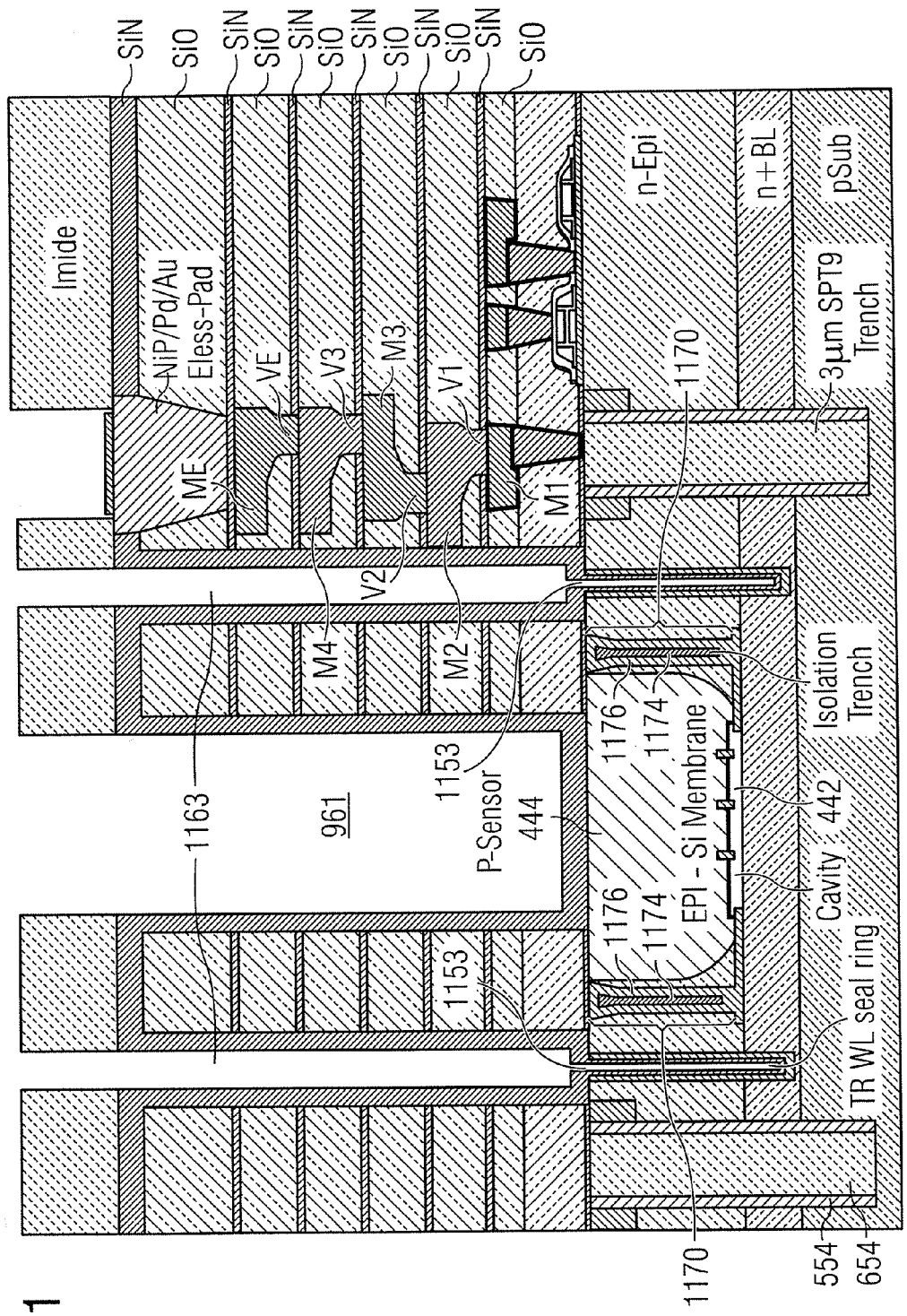
FIG. 11 shows a schematic cross section of a semiconductor device comprising an EPI-Si membrane and independent stress de-coupling with a separate seal ring around the pressure sensor (pressure sensor is example only)

FIG. 11 schematically illustrates a third option for a SPT9P pressure sensor with EPI-Si-membrane according to which an independent stress decoupling with a separate seal ring around the pressure sensor is provided. The first trench(es) 1153 and the third trench(es) 1163 have substantially the same structure as the first and third trenches 953 and 963 in FIG. 9. The first trench(es) 1153 and the third trench(es) 1163 provide mechanical decoupling for the portion of the semiconductor device that comprises the EPI-Si-membrane 444.

In addition to the mechanical decoupling trenches 1153 and 1163, the semiconductor device in FIG. 11 comprises dedicated isolation trenches 1170 with a lining 1176 and a core 1174. The material of the lining 1176 may be an oxide, for example silicon oxide. The material of the core 1174 may be poly silicon or vacuum. The isolation trench(es) 1170 is/are located between the EPI-Si-membrane 444 and the mechanical decoupling trenches 1153, but other arrangements are possible, too.

FIGS. 9 to 11 are relative to pressure sensors comprising an EPI-Si-membrane 444. FIGS. 12 to 15 which will be described next are relative to pressure sensors comprising a membrane 1244 made from polycrystalline silicon (Poly-Si membrane) and located above the upper surface of the epitaxial layer 424. The Poly-Si membrane 1244 is supported by a STI structure 1248, typically STI oxide, which itself is embedded in p-well 1224 that has been created in the n-doped epitaxial layer 424 by counter-doping.

With respect to the membrane, the CMOS process is typically performed first, i.e., before the structuring of the membrane. Typical dimensions may be:

300 nm Poly-Si (thickness of membrane 1244)
50 nm to 100 nm Cavity height
100 sqμm to 200 sqμm area of one sensor cell The sensor is composed of a plurality of sensor cells
An isolation trench is not needed, but may be present anyway.

Figure 12:
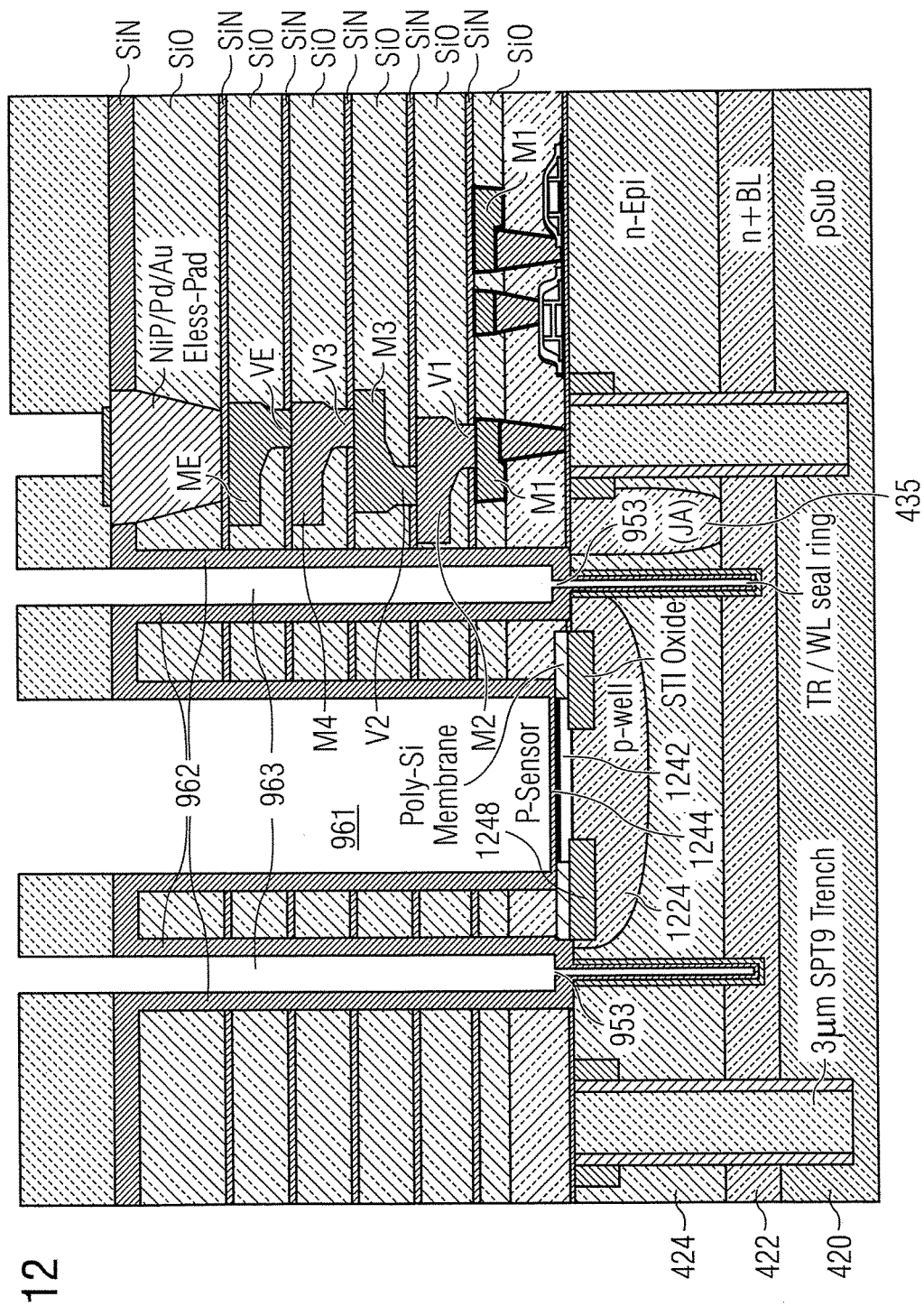
FIG. 12 shows a schematic cross section of a semiconductor device comprising a thin Poly-Si Membrane (or alternatively carbon membrane; Carbon Sensor) and stress de-coupling with trench/sensor release (TR/WL) seal ring around the sensor area.

FIG. 12 schematically illustrates a first option for an SPT9P Thin Poly-Si Membrane (Carbon Sensor). Stress de-coupling is achieved with a TR/WL seal ring around the sensor area. The abbreviation TR relates to the so called "trench module" of the manufacturing process. The abbreviation WL relates to the so called "release etch module" of the manufacturing process. The term "carbon sensor" means that carbon is used as a sacrificial material between the epitaxial layer 424 and the poly-Si membrane 1244. The carbon layer is removed during the release etch step, for example, by etching and/or thermal combustion.

The implementation example according to FIG. 12 may typically provide efficient stress de-coupling, reduced or removed crack risk, and no additional cost adder, as the trench can be run together with a standard process, e.g., SPT9 process. It is possible to use existing process steps and sub-processes for the creation of the mechanical decoupling trenches, typically by simply modifying the corresponding lithography masks and by including the decoupling trenches in the lithography masks. The trench width of the decoupling trenches that is defined in the lithography masks may differ from the trench width of trenches that are used for other purposes, such as electrical isolation or electrical contact for the substrate.

In FIG. 12 the first and third trenches 953 and 963 are mostly similar to the first and third trenches in FIG. 9, with the difference that in FIG. 12 the trenches 953, 963 extend down into the nBL 422, whereas in FIG. 9 the first trenches ended already at the interface between the nBL 422 and the epitaxial layer 424. This may be due to the fact that in the implementation example according to FIG. 12 the epitaxial layer is thinner than in the implementation example of FIG. 9.

Figure 13:
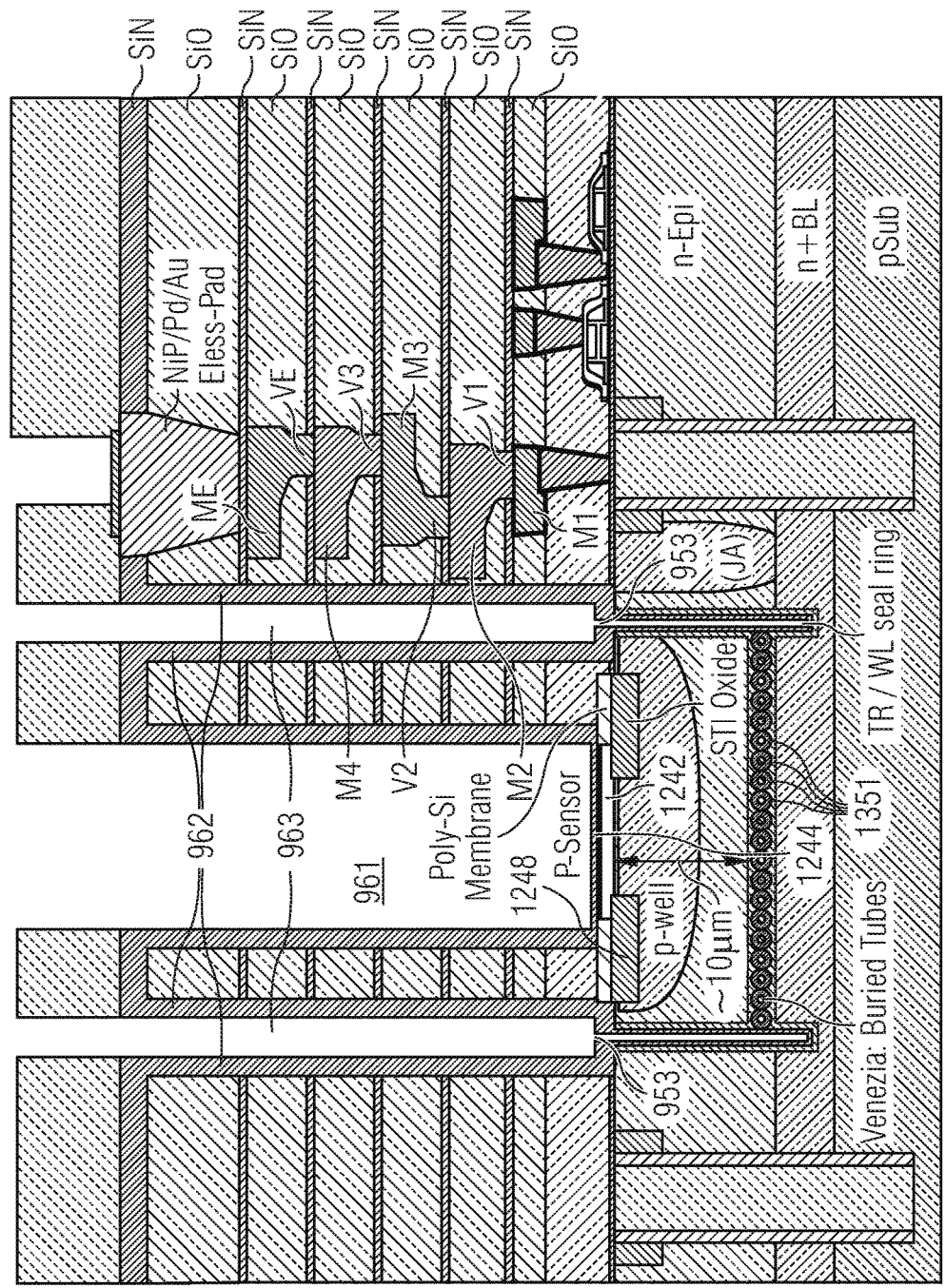
FIG. 13 shows a schematic cross section of a semiconductor device comprising a thin Poly-Si Membrane (or alternatively carbon membrane; Carbon Sensor) and stress de-coupling with trench/sensor release (TR/WL) seal ring around the sensor area on top of Venezia (Buried Tubes/local SOI—"silicon-on-insulator")

FIG. 13 shows a schematic cross section of a semiconductor device that is similar to the semiconductor device of FIG. 12. Thus, FIG. 13 illustrates a second option for a SPT9P Thin Poly-Si Membrane (Carbon Sensor): Stress de-coupling is achieved with a TR/WL seal ring around the sensor area on top of Venezia (Buried Tubes/local SOI).

In addition to the elements shown in FIG. 12, the semiconductor device depicted in FIG. 13 comprises a plurality of buried oxide tubes 1351. The buried oxide tubes 1351 extend substantially parallel to a main surface of the semiconductor device and the interfaces between the various layers. The buried oxide tubes 1351 are located within the epitaxial layer 424 just above the nBL 422.

The buried oxide tubes may be obtained by means of a Venezia process, which is similar or related to the silicon-on-nothing (SON) technology. According to some experts in the technical field, the Venezia process and the silicon-on-nothing are substantially the same. SON's emerged from the Silicon on insulator (SOI) technology which is or was considered one of the attractive approaches for low-power and high-speed applications of metal-oxide-semiconductor (MOS) devices. The silicon-on-nothing (SON) structure, in which a vacant region was formed instead of a buried oxide layer, makes use of the selforganizing recrystallization caused by silicon surface migration. The initial trench shape patterned on the silicon substrate is an important factor to fabricate the SON structure. The trench structure transforms so as to minimize the surface energy, when it is annealed in a deoxidizing ambient, such as hydrogen. Trench transformation by surface migration results in the empty-space-in-silicon (ESS). The SON structure can be made of SON layer over ESS by this means. The shape of the empty space in silicon can be spherical, pipe-shaped and plate-shaped, for example. An isolated deep trench is transformed to a spherical ESS. Formation of the spherical ESS typically begins at the top and bottom corners of the deep trench, because the radius of curvature of these regions is the smallest. This result indicates that the diameter of the spherical ESS becomes larger than that of the initial trench. Thus, trenches closely arranged in a row are transformed to the pipe-shaped ESS, due to the combination of the grown spherical ESS at the bottom of each trench. The plate-shaped ESS can also be fabricated by developing this technique. By arranging the trenches in a lattice, the spherical ESSs at the bottom of all trenches are combined, and they are transformed to a large, thin plateshaped ESS. It is also possible to create curved empty spaces within the silicon with this technique.

In FIG. 13, the buried tubes 1351 are arranged side-by-side to form an "air mattress-like" structure. Each tube comprises a cylindrical central empty space that is bounded by a cylindrical sidewall. The cylindrical sidewall may be made of a passivation material, such as silicon nitride SiN, for example. Furthermore, the plurality of buried tubes may be embedded in silicon oxide SiO with a planar shape.

The plurality of buried tubes 1351 may provide a potentially better stress de-coupling, in particular with respect to mechanical stress that is coupled into the region under the membrane 1244 from beneath. The Venezia technology may make the individual semiconductor devices moderately more expensive, because additional process steps are required. However, electronic components may also benefit from the presence of a Venezia structure such as one or more buried oxide tubes so that the additional cost per wafer might be spent, anyway.

The vertical distance between the plurality of buried tubes 1351 and the cavity 1245 may be approximately 10 μm, for example.

Figure 14:
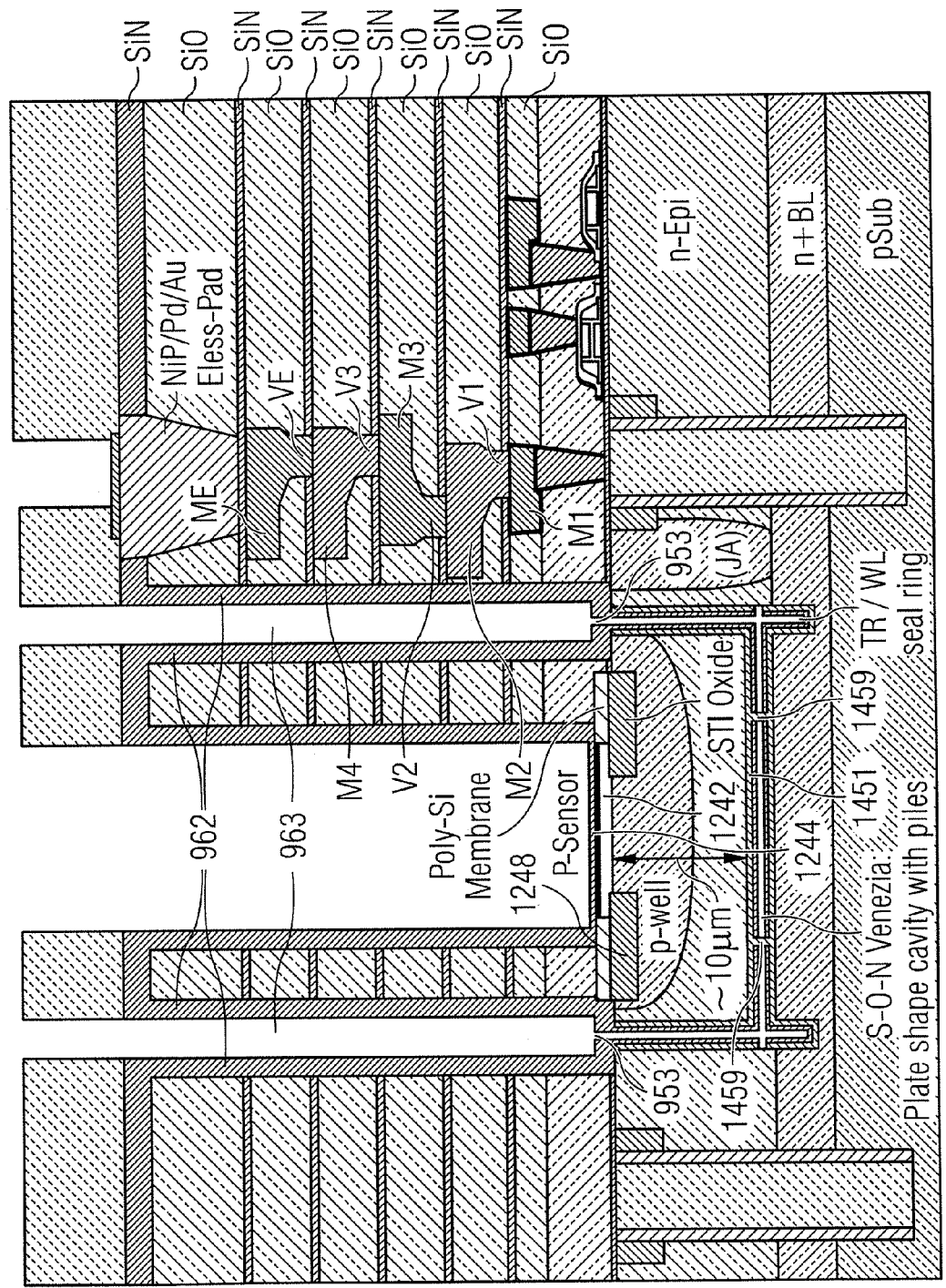
FIG. 14 shows a schematic cross section of a semiconductor device comprising a thin Poly-Si Membrane (or alternatively carbon membrane; Carbon Sensor) and stress de-coupling with TR/WL seal ring around the sensor area on top of Venezia (SON—"silicon-on-nothing")

FIG. 14 shows a further implementation example according to a third option for a SPT9P Thin Poly-Si Membrane (Carbon Sensor). Stress de-coupling is here achieved with a TR/WL seal ring around the sensor area on top of a Venezia structure (SON—Silicon On Nothing). In other words, The Venezia structure comprises here a flat or planar cavity 1451 which can be created by the Venezia process if a plurality of deep holes or trenches are arranged in a lattice within the substrate. In order to vertically support the region of the substrate that carries the sensor structure and the membrane 1244, one or more pillars or piles 1259 may be provided within the cavity 1451.

Figure 15:
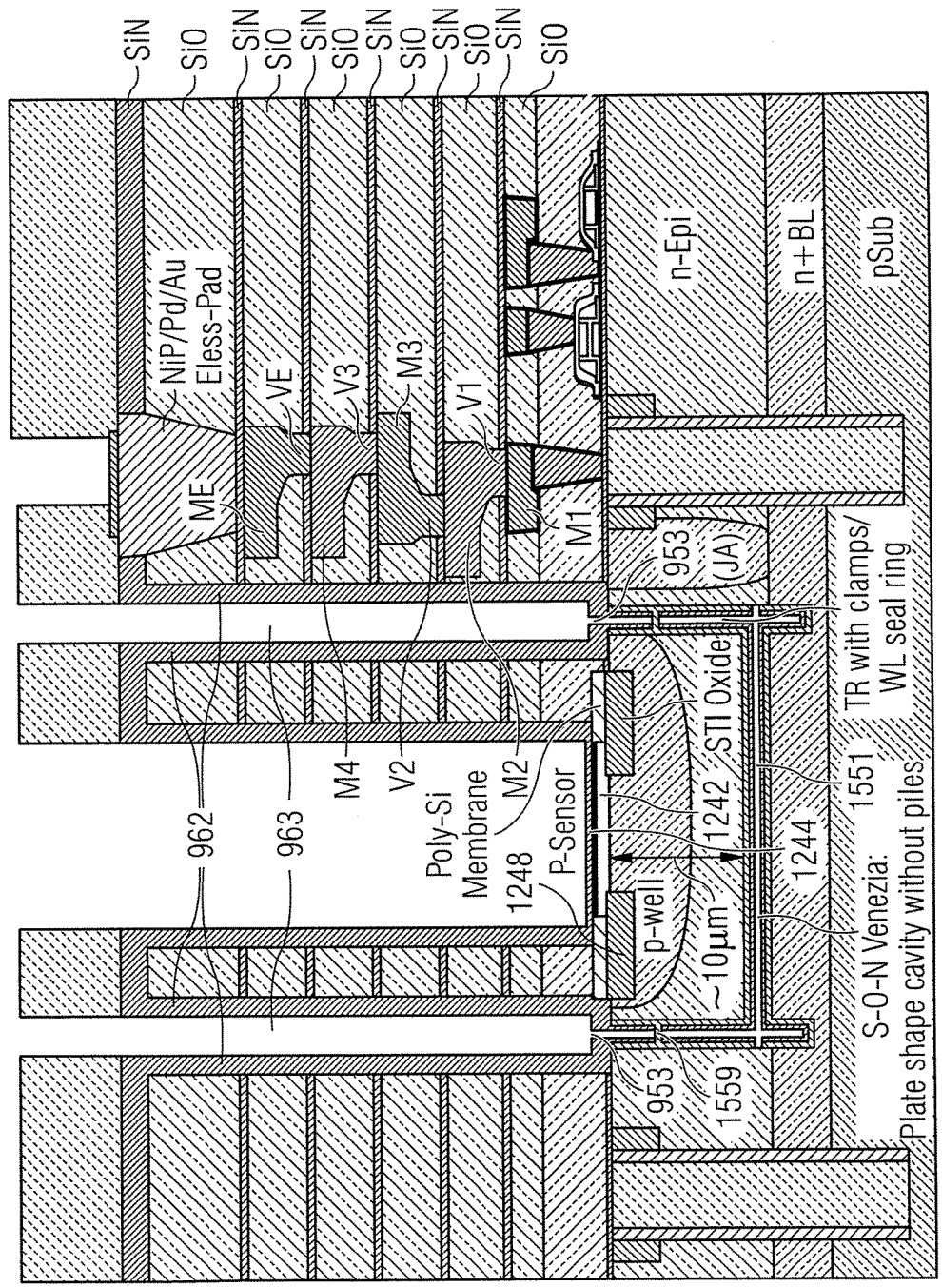
FIG. 15 shows a schematic cross section of a semiconductor device similar to FIG. 18 but with the plate shape cavity having no pillars and instead the decoupling trenches having for supporting the portion of the substrate arrangement that is mechanically decoupled from the surrounding portion.

FIG. 15 is similar to FIG. 14. Again, a plate shape cavity 1551 is provided beneath the sensor region that is to be decoupled mechanically from the surrounding substrate and BEOL stack. The difference to FIG. 14 is that in FIG. 15 there are no piles provided in the plate shape cavity 1551. Instead, one or more clamps 1559 are provided within the first trench(es) 953.

Figure 16:
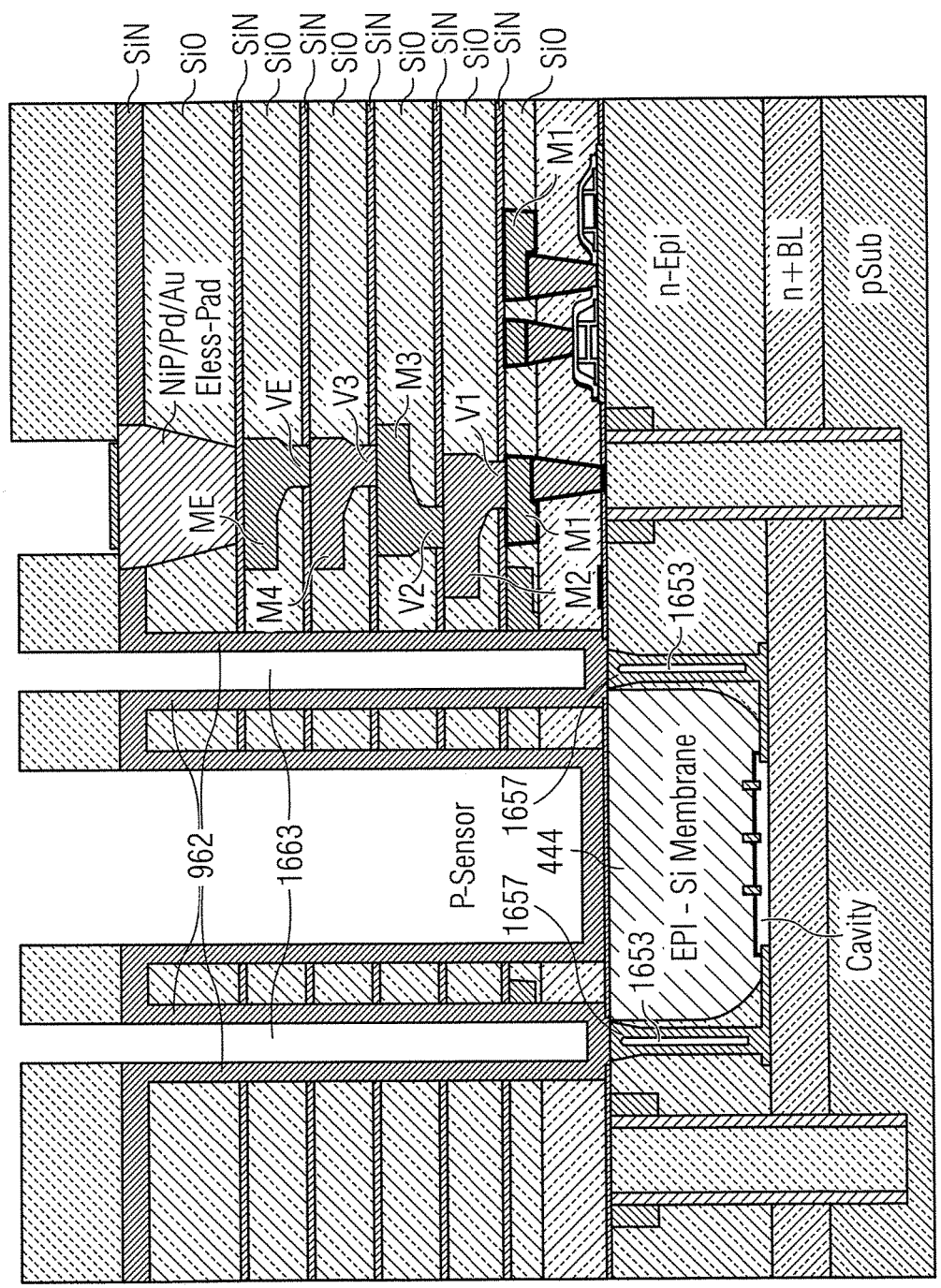
FIG. 16 shows a schematic cross section of a semiconductor device similar to FIG. 15 but with a FEOL portion of the decoupling trench being closed against a BEOL portion of the decoupling trench.

FIG. 16 shows a schematic cross section or a semiconductor device with an EPI-Si-membrane 444, a first trench 1653 (or several first trenches 1653), and a third trench 1663 (or several third trenches 1663). As in preceding figures, the semiconductor device comprises components that have been described above, such as the second trench 454. In FIG. 16, the first trench 1653 is closed at the top by silicon oxide 1657. When the third trench 1663 is passivated, the passivation material 962 also covers the bottom of the third trench 1663 and thus the closing silicon oxide 1657 of the first trench. This arrangement may result in that some mechanical stress can be transmitted from the surrounding substrate and BEOL stack to the sensor region via the silicon oxide 1657 and the passivation material 962. Nevertheless, the first and third trenches 1653, 1663 may typically provide sufficient mechanical decoupling, as the sidewalls of the first and third trenches can be deformed into the cavities of the trenches in order to absorb mechanical stress, at least to some extent.

The arrangement according to FIG. 16 can possibly be manufactured easier than the implementation example of FIG. 9, in which the first and third trenches 953, 963 are connected to each other and possibly their passivation lining is deposited concurrently during the BEOL manufacturing process. In the arrangement according to FIG. 16, a passivation of the first trench 1653 is not necessary because the first trench 1653 is hermetically sealed, anyway. The passivation of the third trench 1663 can be performed during the BEOL process.

Figure 17:
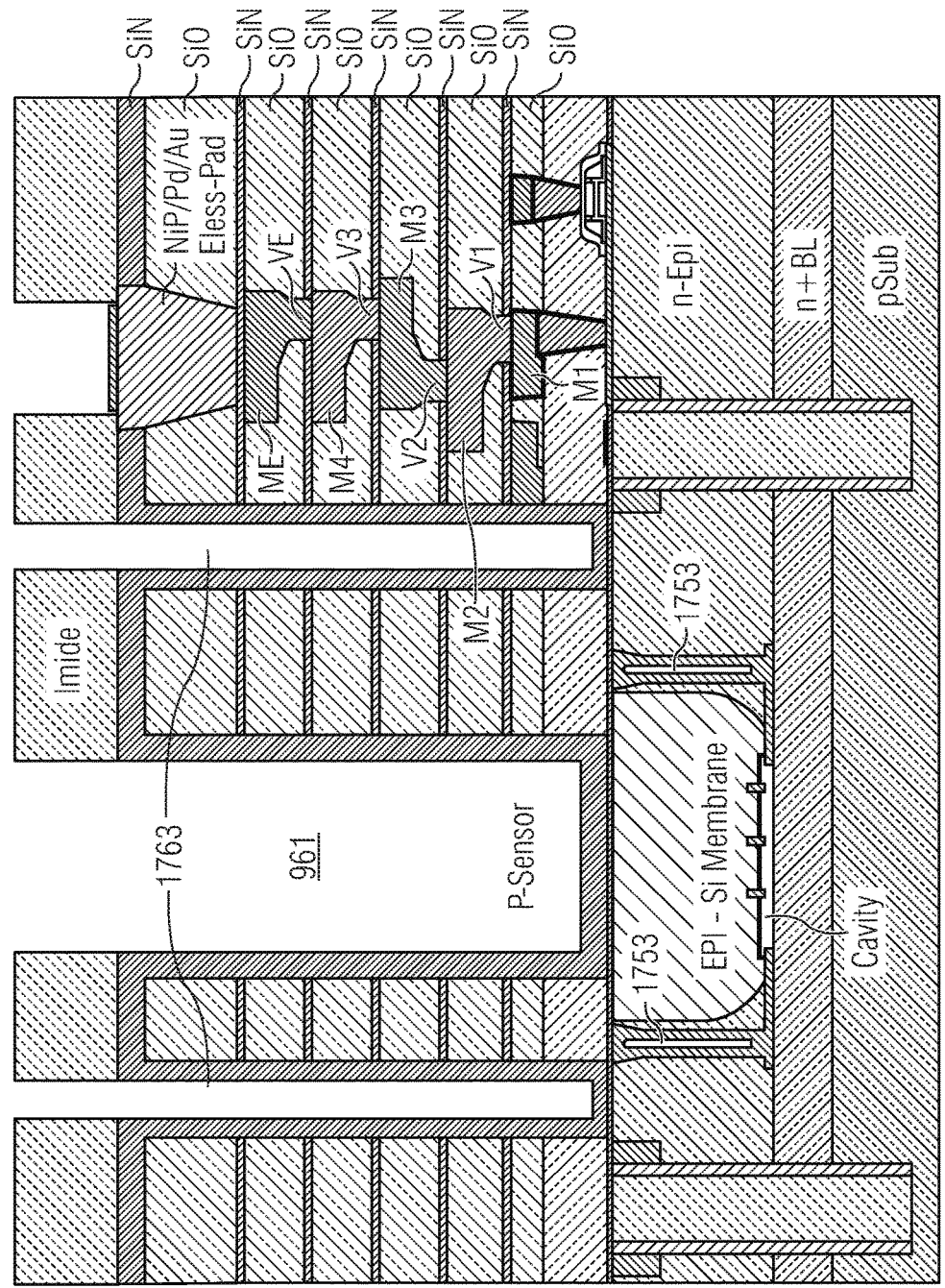
FIG. 17 shows a schematic cross section of a semiconductor device similar to FIG. 20 but with the FEOL portion of the decoupling trench being laterally offset relative to the BEOL portion of the decoupling trench.

FIG. 17 shows a variant of FIG. 16 in which the first and third trenches 1753 and 1763 are laterally offset against each other. The third trench 1763 is farther out than the first trench 1753 relative to the sensor structure and the membrane, but the opposite would also be possible. The arrangement according to FIG. 17 is typically relatively easy to manufacture, as no vertical alignment of the first and third trenches 1753, 1763 has to be performed with relatively high precision.

Figure 18:
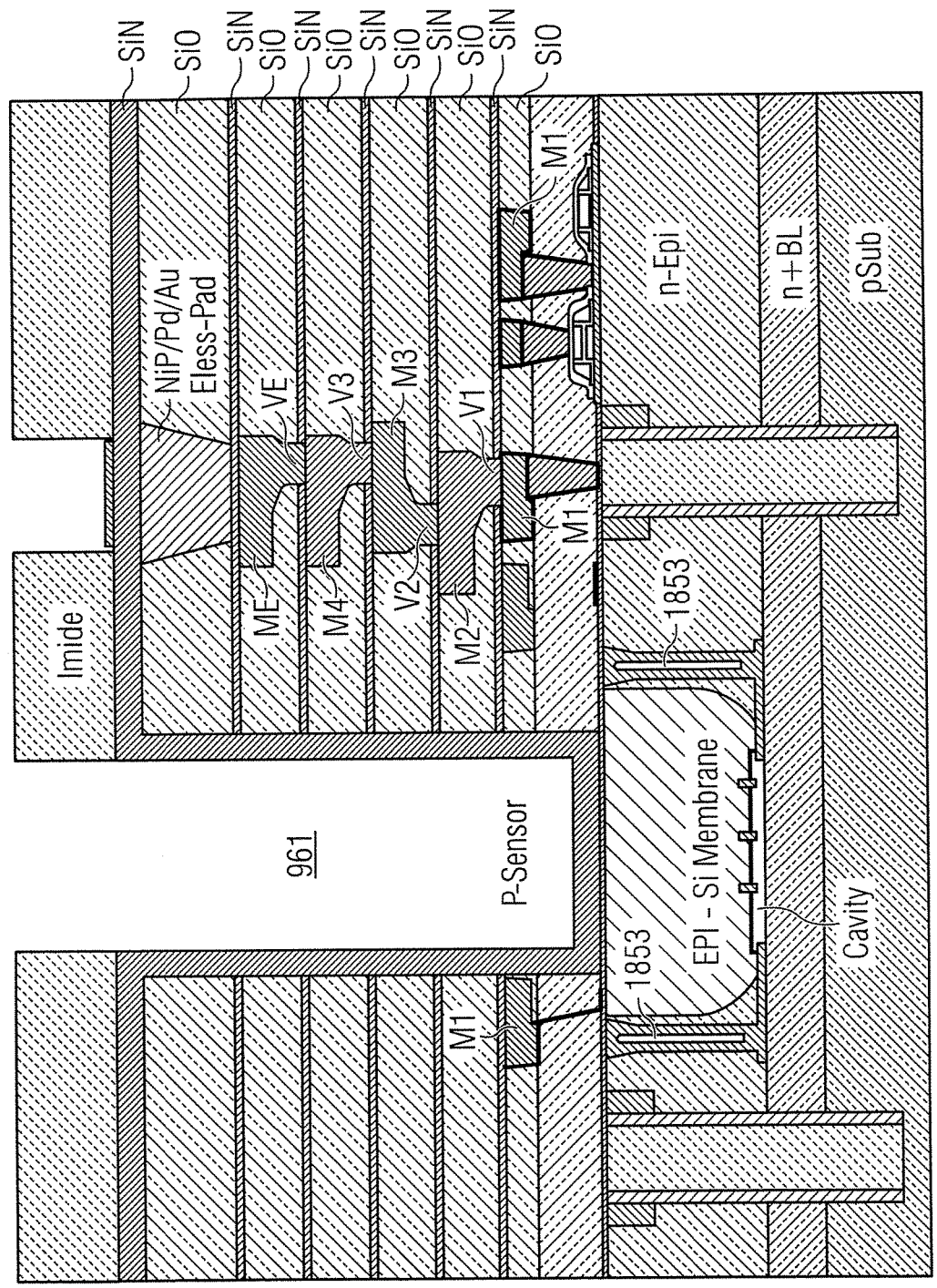
FIG. 18 shows a schematic cross section of a semiconductor device comprising a FEOL decoupling trench only, but no BEOL decoupling trench.

In FIG. 18 the third trench has been omitted so that only one or more first decoupling trench(es) 1853 is/are provided, which are similar to the closed trenches 1653 and 1753 in FIGS. 16 and 17.

Figure 19:
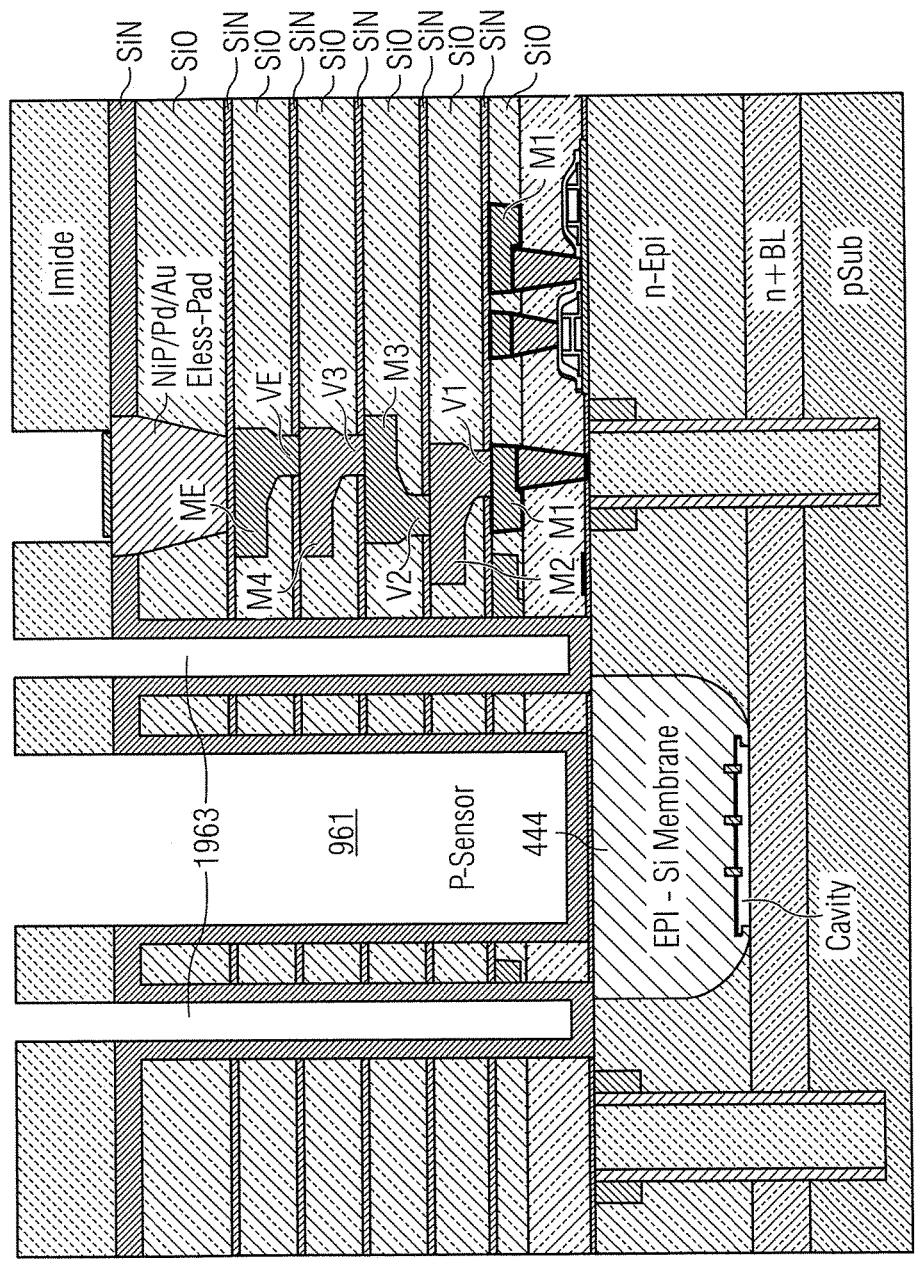
FIG. 19 shows a schematic cross section of a semiconductor device comprising a BEOL decoupling trench only, but no BEOL decoupling trench.

FIG. 19 is the opposite to FIG. 18: The semiconductor device only comprises a decoupling trench 1963 or several decoupling trenches 1963 in the BEOL stack, while the first trench(es) is/are omitted. Note that in FIG. 19 the decoupling trench(es) 1963 in the BEOL may be considered as the "first trench(es)" in accordance with the wording of the claims. The sensor opening 961 may be regarded as the "second trench(es)" in the wording of the claims. This means that a corresponding method may comprise a step of concurrently etching the first trench 1963 (the decoupling trench in the BEOL stack) and the second trench 961 (the sensor opening) in a semi-finished semiconductor device. The first trench 1663 is a mechanical decoupling trench between a first region (among others: the membrane 444) of an eventual semiconductor device and a second region thereof (the surrounding region of the BEOL stack). The method may further comprise concurrently passivating or insulating sidewalls of the first trench 1963 and of the second trench 961. As can be seen in FIG. 19, the passivation material 962 covers the sidewalls of both, the decoupling trench 1963 ("first trench") and the sensor opening 961 ("second trench"). The actions of currently etching and concurrently passivating are performed during a back-end-of-line process so that the first trench and the second trench are formed in a back-end-of-line portion of the semi-finished semiconductor device.

Figure 20:
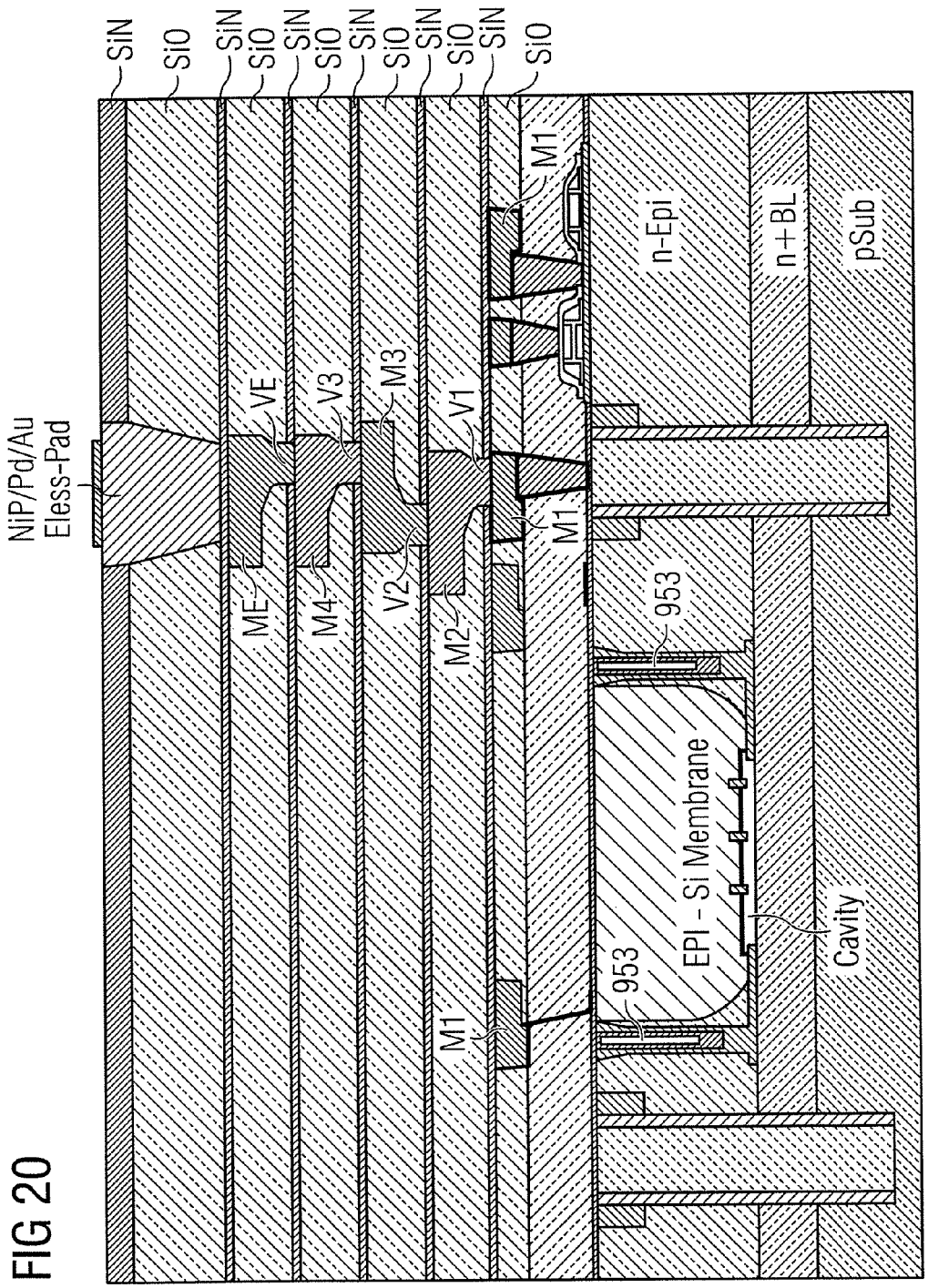
FIG. 20 shows a schematic cross section of a semi-finished semiconductor device after a BEOL layer stack has been created, but not yet structured.
Figure 21:
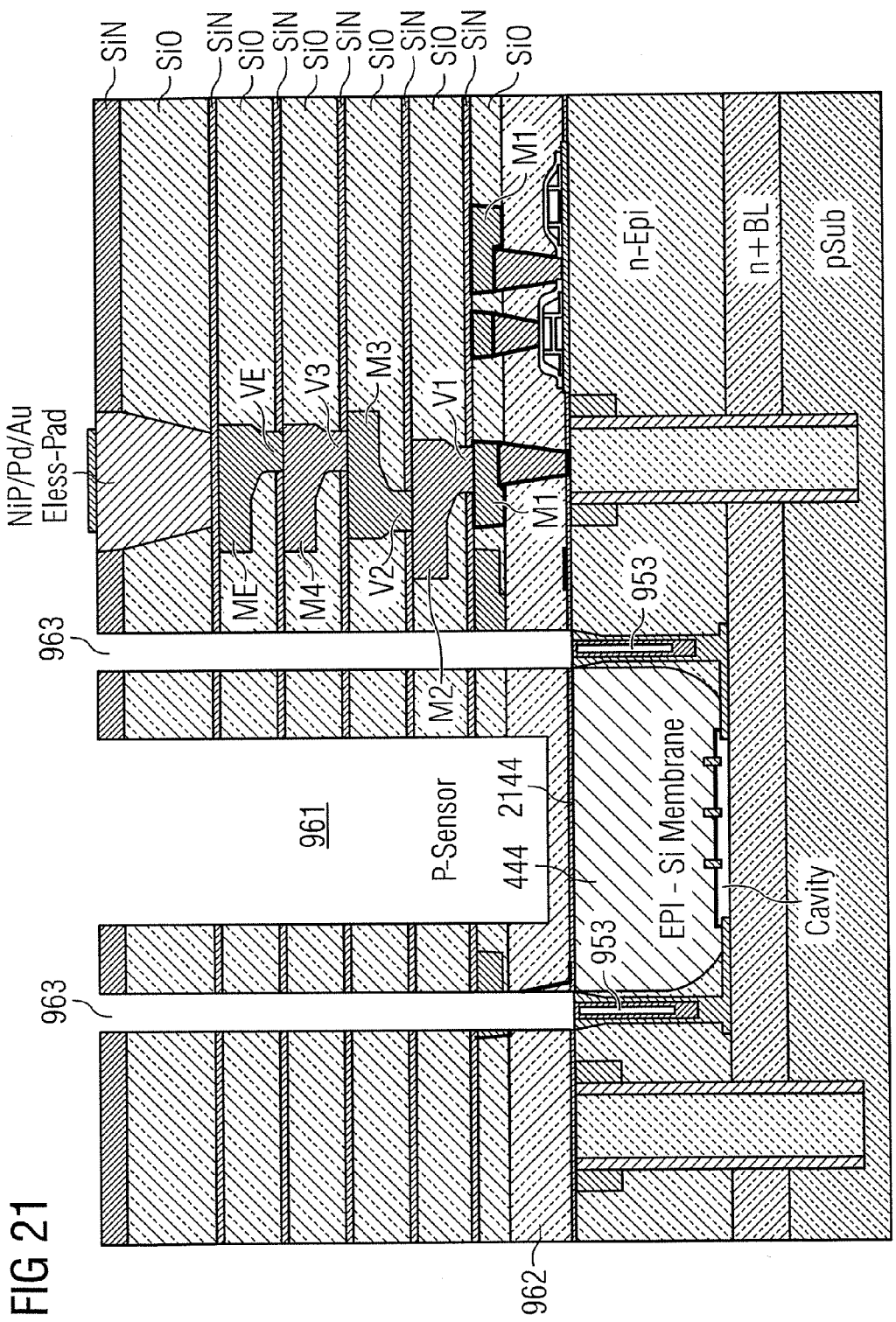
FIG. 21 shows a schematic cross section of the semi-finished semiconductor device from FIG. 24 after a sensor opening and at the same time one or more BEOL portions of a decoupling trench have been performed formed.
Figure 22:
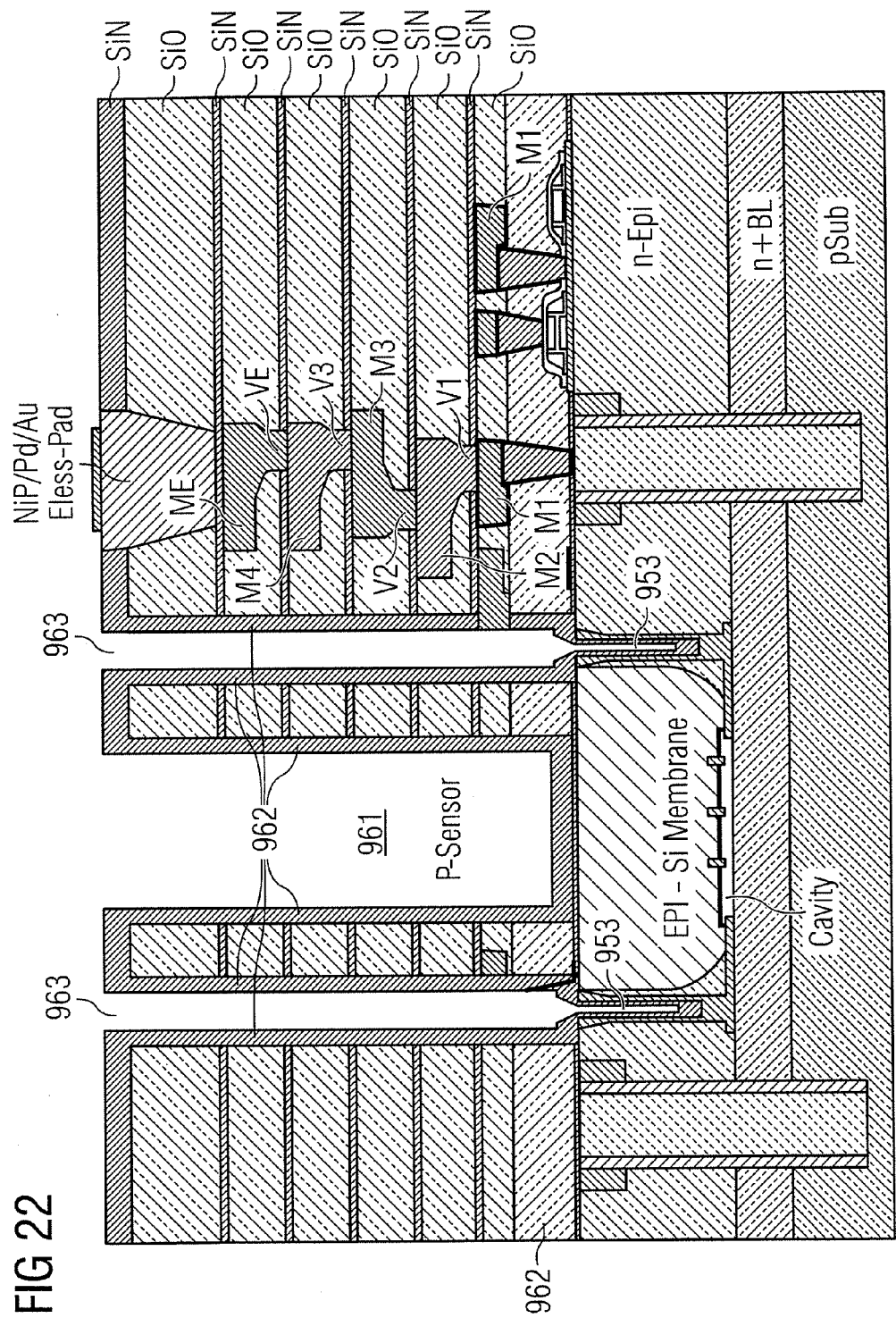
FIG. 22 shows a schematic cross section of the semi-finished semiconductor device from FIG. 25 after a passivation has been applied to sidewalls of the BEOL trench(es) and simultaneously to sidewalls of the previously re-opened FEOL trench(es)

FIGS. 20, 21, and 22 shows successive stages of a BEOL process. In FIG. 20, the various BEOL layers have already been created, including the metallizations M1, M2, M3, M4, ME, and the vias V1, V2, V3, VE. In the FEOL portion of the semiconductor device, the first trench 953 is already present.

FIG. 21 shows a schematic cross section after the decoupling trenches 963 ("third trenches"), and the sensor opening 961 have been etched. Etching the third trenches 963 also opens the first trenches 953 once the etching process reaches the bottom of the PSG layer 962. An etch stop layer 2144 is provided at an upper surface of the membrane 444 so that the membrane 444 is not etched. In alternative embodiments, a selective etching process may be used that has a substantially higher etch rate in silicon oxide and silicon nitride than in silicon. The membrane 444 is typically made from silicon. The first trench 953 is lined with silicon oxide or a similar material, i.e. a passivation and/or insulation material. In case the first trench 953 was additionally filled with, for example, poly silicon, this filling material is also removed during the etching process to leave an open void or cavity.

FIG. 22 shows a further stage of the BEOL process after the passivation material 962 has been deposited concurrently in the first trench 953, the third trench 963 (BEOL portion of the decoupling trench), and the sensor opening 961.

Figure 25:
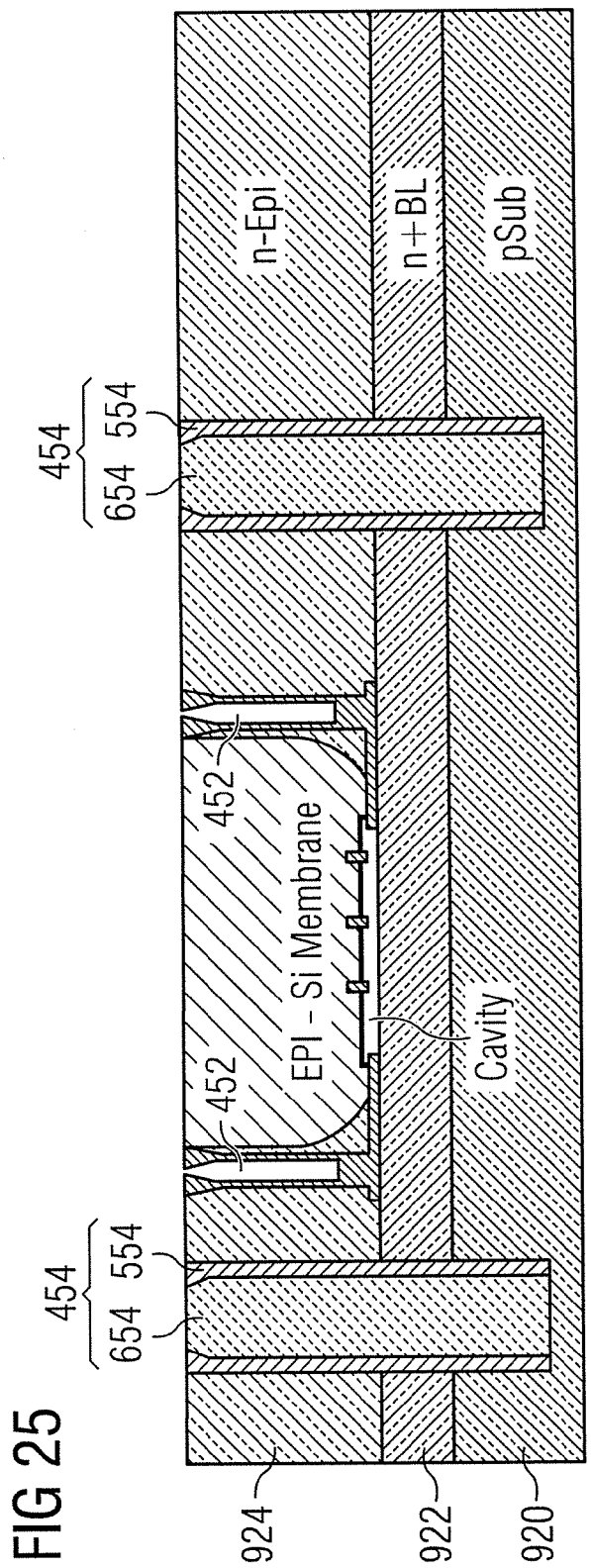
FIG. 25 shows a schematic cross section of the semi-finished semiconductor device from FIG. 28 after passivation and/or insulation of sidewalls of the trenches.

FIGS. 23 to 25 show different stages of a FEOL manufacturing process. FIG. 23 shows a schematic cross section of the semi-finished semiconductor device after the first trench 452 and the second trench 454 have been etched concurrently in the substrate arrangement. The first trench 452 is relatively narrow and therefore only reaches a depth that corresponds approximately to the interface between the nBL 922 and the epitaxial layer 924. However, the width and/or the depth of the first trench 452 may be adjusted according to what is appropriate for the semiconductor device at hand.

In FIG. 24 a passivation and/or insulation material 552 has been deposited at the sidewalls of the first trench 452. During the same deposition process, the same passivation and/or insulation material 554 has been deposited at the sidewalls of the second trench 454. Due to the nature of the deposition process and the material, the passivation/insulation material 552 and 554 tends to grow together near the openings of the first and second trenches 452, 454. As the first trench 452 is relatively narrow, this effect results in that the insulation/passivation material 552 closes the first trench and leaves a void or void filament within the first trench.

FIG. 25 shows the semi-finished semiconductor device after a poly-silicon deposition process has been performed and the deposited poly-silicon has been structured. As a result, the deposited poly-silicon 654 has been left in the second trenches. The poly-silicon is not deposited in the first trench 452 because the first trench 452 is closed due to the preceding insulation/passivation material deposition.

Figure 26:
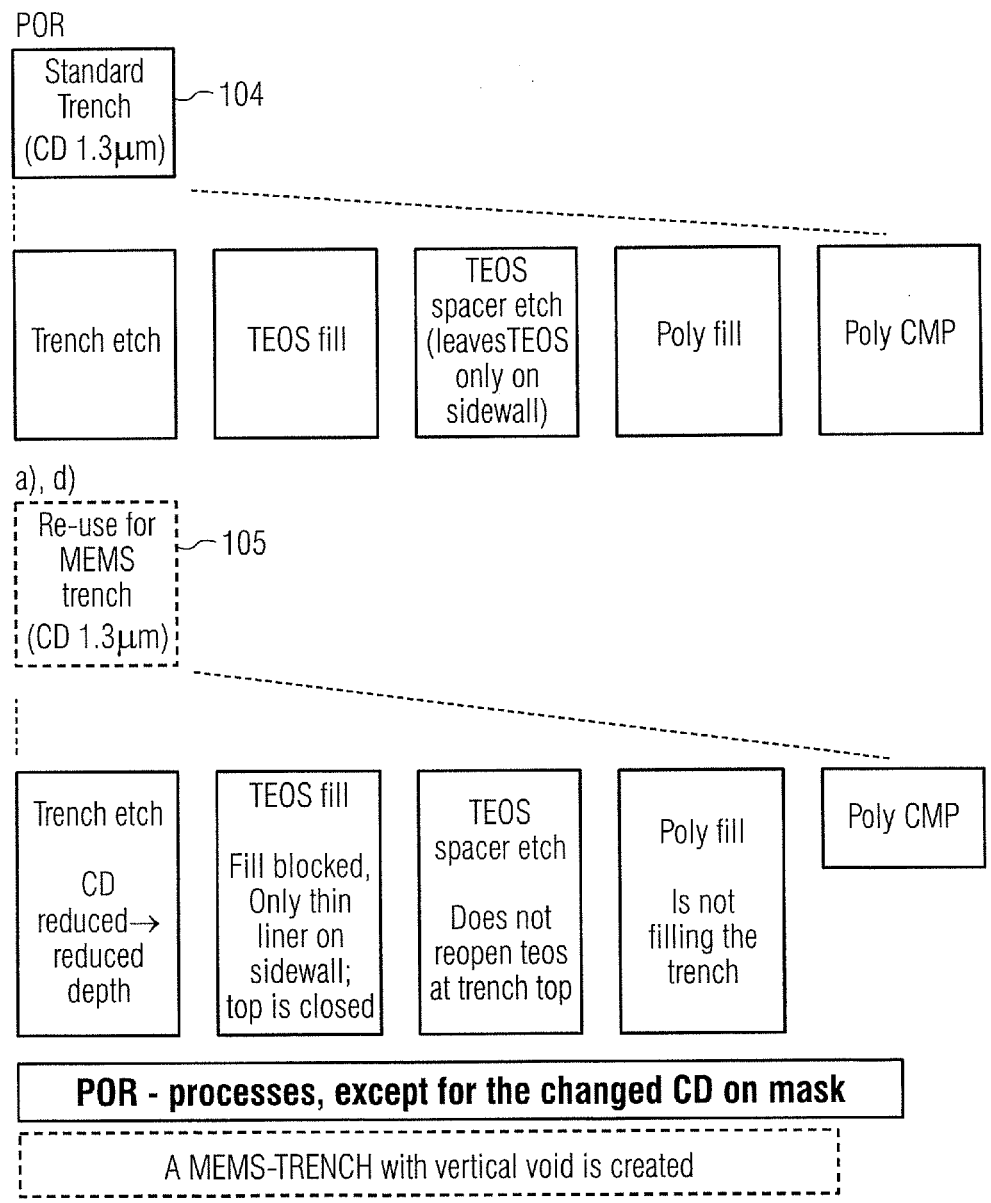
FIG. 26 schematically illustrates two options for how a standard process module for standard trenches can be reused for simultaneous creation of standard trenches and decoupling trenches.

FIG. 26 shows a comparison between the standard module 104 of a manufacturing process and the modified module 105 according to aspects described herein. The standard module 104 is the standard trench module which is typically performed during the FEOL stage to drill a standard trench, to fill the standard trench, and to condition a surface of the semi-finished semiconductor device for subsequent process step. The standard process is also called a "process of record" (POR). According to the POR, the standard trench module 104 comprises the following steps or sub-processes: trench etch, TEOS fill (tetraethyl orthosilicate fill), TEOS spacer etch, Poly-Si fill, and Poly-Si CMP (chemical mechanical polishing). According to this implementation example, TEOS is used as the passivation/insulation material. The TEOS spacer etch typically leaves TEOS only on the sidewalls of the standard trenches, and removes the TEOS everywhere else, including the bottoms of the standard trenches. The chemical mechanical polishing step brings the surface of the semi-finished semiconductor device in a condition that is suitable for performing any subsequent manufacturing steps, such as the BCD module 107 (see FIG. 1), for example.

The lower part of FIG. 26 shows the modified module 104 (or the modification of the module 104) in order to re-use said module 104 for a concurrent, simultaneous creation of decoupling trenches.

The following process modules or process groups are available in the SPT9P BCD FEOL process on which at least some implementation examples of the present invention are based:

The SPT9 standard trench (e.g., trench 454 in the preceding description and the corresponding figures) typically has a trench width CD of, for example, 3 μm and a depth of, for example, 20 μm. The standard trench is isolated by oxide, centrally filled with poly-silicon, and covered by STI oxide.

This standard trench module can be reused for forming a decoupling trench according to different options, four of which are listed below:

a) Derived from the trench module (by means of a CD reduction from 3 μm to 1.7 . . . 1.1 μm): MEMS trench (i.e., mechanical decoupling trench). The MEMS trench is for example 7 . . . 12 μm deep. The sidewalls are isolated by TEOS oxide. The MEMS trench is unfilled (no poly silicon), because the trench is closed at the top edge during the oxide filling process and therefore prevents the subsequent poly-silicon fill process completely or at least sufficiently. The MEMS trench is covered with STI oxide; in this manner a covered, inside hollow trench is formed.

b) partially clearing or unfilling of the SPT9 standard trench (poly etch or unilateral oxide etch (preferred); both are wet etching processes) in the pressure sensor module. Closure is done together with the sensor closure. Option b) is schematically illustrated in FIG. 27 in block diagram form. A detail is illustrated in FIG. 27 relative to a change in the sensor module to open ("drill") the standard trench. The process of record ("POR") comprises the sensor module. In order to adapt the process of record to the proposed creation of decoupling trenches, an additional step is added, namely opening the standard trench. In this manner, a standard trench with a vertical void is created.

c) partially clearing or unfilling of the SPT9 standard trench (poly etch or unilateral oxide etch (preferred); both are wet etching processes) after the sensor release etch; passivation with the sensor release passivation. This option is performed only after the pressure sensor release module. FIG. 28 schematically illustrates in block diagram form option c) and the detail of a change in the sensor release module to open ("drill") the standard trench. The process of record comprises a standard sensor release module. According to option c), an additional step is performed subsequent to the standard sensor release module. The additional step comprises an opening of the standard trench so that a standard trench with a vertical void is created.

d) opening of the MEMS trench after the sensor release etch; passivation with the sensor release passivation. FIG. 29 schematically illustrates in block diagram form option d). The additional step is the opening of the MEMS trench ("first trench" or decoupling trench). As a result, the MEMS trench with a preexisting vertical void is opened. The STI/TEOS seal is opened up to reach the preexisting void.

Thus, a creation of one decoupling trench or a succession of decoupling trenches in the substrate can be obtained. For option a), basically no additional manufacturing costs accrue. For options b), c), and d) typically no additional manufacturing costs or only little additional manufacturing costs are caused.

The following process modules or process groups are available in the pressure sensor release manufacturing module on which at least some implementation examples of the present invention are based, in particular a sensor release etch through the entire BEOL with an etch stop on the sensor poly-silicon, and subsequent passivation (nitride 20 . . . 200 μm) from the sidewall and bottom of the etching-exposed structure.

As a result, a creation of a passivated decoupling trench in the BEOL at substantially no extra cost is made possible. Regarding the film stress of the BEOL layers, a decoupling in particular at the reference cell (which has the BEOL film stack on its lamella) can be observed, but also at the sensor cell (where the BEOL film stack rests on the sensor edge).

The following additional module for stress decoupling is available, in addition to the above-mentioned BCD/Sensor related modules, inter alia the creation of a Venetia lamella prior to the EPI deposition (7 μm thickness) beneath the entire sensor region.

Thus, a creation of a horizontal substrate decoupling lamella prior to the BCD processing using an additional Venetia module is possible (extra costs may be incurred).

The above mentioned options a)-d) may be further combined as follows:

Options a) and b) may also be combined with a BEOL decoupling trench (aligned or slightly offset). In this manner, a bridge (STI and passivation) would remain between substrate and BEOL.

Options c) and d) represent de facto the combination of substrate and BEOL trench. In these cases, no bridge remains between BEOL and substrate. This may be technologically slightly more ambitious, in particular the passivation. Note that option c) corresponds already to a combination of FEOL (substrate) and BEOL trenches, because in this variant the SPT9 standard trench excavation (clearing or unfilling) only happens after the BEOL sensor release opening (=pressure sensor release module). Therefore, a continuous FEOL+BEOL trench is present, per default, and the trench has to be opened anyway.

All options a) to d), as well as a) and b) with BEOL trench, can be combined with the Venetia lamella. Typically, suspension points have to remain at the sides. All options can be used individually, i.e. without being combined.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. A method comprising:
concurrently etching a first trench and a second trench in a semi-finished semiconductor device, wherein the first trench is a mechanical decoupling trench between a first region of an eventual semiconductor device and a second region thereof; and
concurrently passivating sidewalls of the first trench and of the second trench,
wherein the actions of currently etching and concurrently passivating are performed during a front-end-of-line process or a back-end-of-line process, wherein in the case of the front-end-of-line process the first trench and the second trench are formed in a front-end-of-line portion of the semi-finished semiconductor device, and in the case of the back-end-of-line process the first trench and the second trench are formed in a back-end-of-line portion of the semi-finished semiconductor device, wherein the method further comprises etching a third trench in the semi-finished semiconductor device, wherein the third trench is a further mechanical decoupling trench between the first region and the second region of the semi-finished semiconductor device in the back-end-of-line portion, and wherein the first trench and the second trench are formed in the front-end-of-line portion, wherein the first trench and the third trench are aligned to each other in a direction perpendicular to a main surface of the semi-finished semiconductor device, and wherein etching the third trench comprises re-opening the first trench, and wherein the method further comprises concurrently passivating the sidewalls of the first trench and sidewalls of the third trench.

2. A method comprising:

concurrently etching a first trench and a second trench in a semi-finished semiconductor device, wherein the first trench is a mechanical decoupling trench between a first region of an eventual semiconductor device and a second region thereof; and concurrently passivating sidewalls of the first trench and of the second trench, wherein passivating or insulating the sidewalls of the first trench causes the first trench to be closed at a surface-near end of the first trench and thus a void or void-filament to be formed within the first trench, while the second trench is not closed when passivating or insulating the sidewalls, and wherein the method further comprises:

performing a release etch of a structure of the semi-finished semiconductor device during a back-end-of-line process; and re-opening the first trench during the release etch.

3. The method according to claim 1, wherein the second trench is wider than the first trench.

4. A method comprising:

concurrently etching a first trench and a second trench in a semi-finished semiconductor device, wherein the first trench is a mechanical decoupling trench between a first region of an eventual semiconductor device and a second region thereof;

concurrently passivating sidewalls of the first trench and of the second trench; and performing a Venetia process to form a cavity beneath the first region to provide a mechanical decoupling of the first region in a direction perpendicular to a main surface of the semi-finished semiconductor device, the cavity extending substantially parallel to said main surface at a depth within the semi-finished semiconductor device.

5. The method according to claim 1, wherein the first and second trench are formed in a front-end-of-line portion of the semi-finished semiconductor device and the method further comprises:

filling at least the first trench with a fill material subsequent to passivating or insulating the sidewalls of the first trench; and at least partially clearing out the first trench by etching at least one of the fill material, a passivation material of the sidewall of the first trench, and an insulation material of the sidewall of the first trench.

* * * * *